US012748272B2

(12) United States Patent
Uemura

(10) Patent No.: US 12,748,272 B2
(45) Date of Patent: Sep. 29, 2026

(54) OPTICAL MODULE

(71) Applicant: SUMITOMO ELECTRIC INDUSTRIES, LTD., Osaka (JP)

(72) Inventor: Hiroshi Uemura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 169 days.

(21) Appl. No.: 18/394,168

(22) Filed: Dec. 22, 2023

(65) Prior Publication Data

US 2024/0219662 A1 Jul. 4, 2024

(30) Foreign Application Priority Data

Dec. 28, 2022 (JP) ................................ 2022-212288

(51) Int. Cl.
*G02B 6/42* (2006.01)
*H01S 5/0239* (2021.01)

(52) U.S. Cl.
CPC ......... *G02B 6/4269* (2013.01); *G02B 6/4253* (2013.01); *G02B 6/4259* (2013.01);
(Continued)

(58) Field of Classification Search
CPC .. G02B 6/4251; G02B 6/4253; G02B 6/4257; G02B 6/4259; G02B 6/4266;
(Continued)

(56) References Cited

U.S. PATENT DOCUMENTS 3,781,902 A * 12/1973 Shim .................... H04N 1/0678 346/24
6,252,726 B1 * 6/2001 Verdiell .............. H01S 5/02208 385/94

(Continued)

FOREIGN PATENT DOCUMENTS

CN 107703590 A * 2/2018 ............... H01S 3/04
EP 1237025 A2 * 9/2002 ............. H05K 1/141

(Continued)

OTHER PUBLICATIONS

English translation of CN-107703590-A (Year: 2018).*

(Continued)

*Primary Examiner* — Uyen N Le
*Assistant Examiner* — Darby M. Thomason
(74) *Attorney, Agent, or Firm* — McDonald Hopkins LLC

(57) ABSTRACT

An optical module according to one embodiment includes: a glass board having a first face, a second face, and a via. The optical module includes: an electrical element mounted on the first face; a heat conduction member mounted on the second face and thermally connected to an electrical element through the via, and an optical element mounted on the first face and converting between the electrical signal and the optical signal. The optical module includes: a temperature control element mounted on the second face and thermally connected to the optical element through the via and for adjusting the temperature of the optical element; electrical wiring electrically connecting the electrical element to the optical element and constituting a transmission line for transmitting the electrical signal; and a first housing connected to the first face and hermetically sealing the electrical element and the optical element.

12 Claims, 20 Drawing Sheets

(52) U.S. Cl.
CPC .......... *G02B 6/4283* (2013.01); *H01S 5/0239* (2021.01); *G02B 6/4271* (2013.01)

(58) Field of Classification Search
CPC .. G02B 6/4267; G02B 6/4269; G02B 6/4271; G02B 6/4272; G02B 6/4273; G02B 6/4283; H01S 5/0239
See application file for complete search history.

(56) References Cited

U.S. PATENT DOCUMENTS

| | | | | |
|---|---|---|---|---|
| 6,320,257 | B1 | 11/2001 | Jayaraj et al. | |
| 6,502,999 | B1 | 1/2003 | Cohen et al. | |
| 10,115,671 | B2 * | 10/2018 | Shenoy | H10W 70/614 |
| 10,593,606 | B2 * | 3/2020 | Seki | H10W 70/692 |
| 10,732,265 | B1 * | 8/2020 | Parameswaran | H01S 3/2308 |
| 2002/0118924 | A1 * | 8/2002 | Murata | G02B 6/4257 385/52 |
| 2003/0053765 | A1 | 3/2003 | Oda et al. | |
| 2005/0184374 | A1 * | 8/2005 | Ohe | G02B 6/4206 257/678 |
| 2008/0247712 | A1 * | 10/2008 | Hogen | G02B 6/4201 385/92 |
| 2009/0122493 | A1 * | 5/2009 | Hosking | G02B 6/4201 361/719 |
| 2012/0045183 | A1 * | 2/2012 | Fujimura | G02B 6/42 385/93 |
| 2012/0075216 | A1 * | 3/2012 | Black | G02B 26/001 345/173 |
| 2016/0085038 | A1 * | 3/2016 | Decker | G02B 6/428 385/14 |
| 2016/0143148 | A1 | 5/2016 | Hosomi | |
| 2018/0156972 | A1 * | 6/2018 | Kainuma | H05K 1/183 |
| 2020/0174205 | A1 | 6/2020 | Kubo et al. | |
| 2021/0333492 | A1 | 10/2021 | Nakao | |
| 2021/0389532 | A1 | 12/2021 | Lam et al. | |

FOREIGN PATENT DOCUMENTS

| | | | | | |
|---|---|---|---|---|---|
| EP | 4050389 | B1 | * | 9/2025 | G02B 6/12004 |
| JP | 2000-357770 | A | | 12/2000 | |
| JP | 2003-533009 | A | | 11/2003 | |
| JP | 2006179564 | A | * | 7/2006 | |
| JP | 2011-174763 | A | | 9/2011 | |
| JP | 2013-538010 | A | | 10/2013 | |
| JP | 2016-096300 | A | | 5/2016 | |
| JP | 6477105 | B2 | * | 3/2019 | |
| JP | 2020-086389 | A | | 6/2020 | |
| JP | 2020-526754 | A | | 8/2020 | |
| JP | 2021-173875 | A | | 11/2021 | |
| WO | 01/16634 | A1 | | 3/2001 | |
| WO | 2012/040063 | A1 | | 3/2012 | |
| WO | 2019/010320 | A1 | | 1/2019 | |
| WO | WO-2019198180 | A1 | * | 10/2019 | G02F 1/0344 |

OTHER PUBLICATIONS

English translation of JP-6477105-B2 (Year: 2019).*
English translation of WO 2019198180 A1 (Year: 2019).*
English translation of JP-2006179564-A (Year: 2006).*

* cited by examiner

D1
D2
D3
21
4(4b)
22
2b
2c
24
22b
6
5c
5
5b
25d
26
(28)
23b
23c
23d
23
25d
7c
7
7b
8
25d
26(27)
25c
25f
25b
23c
26(27)
25c
25f
23d
25b

OPTICAL MODULE

CROSS-REFERENCE TO RELATED APPLICATION

This application claims priority from Japanese Patent Application No. 2022-212288, filed on Dec. 28, 2022, the entire subject matter of which is incorporated herein by reference.

TECHNICAL FIELD

The present disclosure relates to optical modules.

BACKGROUND

Japanese Unexamined Patent Publication No. 2021-173875 describes an optical module. The optical module includes a casing having an internal space, an optical component accommodated in the internal space of the casing, and a lid sealing the internal space of the casing. The casing is hermetically sealed by closing an opening with the lid. The optical components include a light source, an optical transmitter circuit, an optical receiver circuit, a high-speed LSI (large-scale integration), a heat sink block, and a Peltier element. The heat sink block is a cooling component cooling the high-speed LSI. The Peltier element is a cooling component cooling the light source, the optical transmitter circuit, and the optical receiver circuit. The Peltier element is hermetically sealed inside the casing together with the optical transmitter circuit and the optical receiving circuit.

Japanese Unexamined Patent Publication No. 2020-086389 describes an optical component. The optical component includes a casing, wiring formed in the casing, an optical circuit element arranged inside the casing, a mount for mounting the optical circuit element, a wiring board, and a lid. The optical components are flip-chip-mounted on the external wiring board. The optical circuit element has an optical circuit formed of the optical waveguide. The portion of the optical circuit that performs photoelectrical conversion and electro-optical conversion is connected to wiring by the connecting means such as the bonding wire. Since the casing is sealed by the lid, moisture and the like are prevented from entering the inside of the casing. In some cases where the temperature control element may be arranged instead of the mount, the temperature control element is sealed together with the optical circuit.

"A thermoelectric cooler integrated with IHS on a FC-PBGA package", Chih-Kuang Yu, Chun-Kai Liu, Ming-Ji Dai, Sheng-Liang Kuo, and Chung-Yen Hsu, 2007 26th International Conference on Thermoelectrics includes a BGA (ball grid array) board, a chip mounted on the BGA board, a TEC (thermo electric cooler) mounted on the chip, and the casing accommodating the chip and the TEC. An upper face (circuit face) of the chip is flip-chip-mounted on the BGA board. A lower face (substrate face) of the chip is connected to an IHS (integrated heat spreader) through the TEC. The chip is pressed down from above and below by the BGA board and the TEC.

By the way, the electrical elements and the optical elements are required to be protected more reliably in order to improve the reliability. For example, in some cases, the electrical elements and the optical elements may be affected by stress due to expansion or contraction due to temperature changes in the state where the electrical elements and the optical elements are hermetically sealed within the casing. Therefore, there may be a need to protect the electrical elements and the optical elements hermetically sealed from the effects of the stress and the like, and to enable high-speed signal transmission between the electrical elements and the optical elements.

SUMMARY

An object of the present disclosure is to provide an optical module enabling high-speed signal transmission between an electrical element and an optical element.

An optical module according to the present disclosure includes a glass board having a first face, a second face opposite to the first face, and a via penetrating between the first face and the second face. The optical module includes: an electrical element mounted on the first face and processing an electrical signal; a heat conduction member mounted on the second face and thermally connected to the electrical element through the via, and an optical element mounted on the first face and converting between the electrical signal and an optical signal. The optical module includes: a temperature control element mounted on the second face, thermally connected to the optical element through the via, and for adjusting temperature of the optical element; electrical wiring electrically connecting the electrical element to the optical element and constituting a transmission line for transmitting the electrical signal; and a first housing connected to the first face and hermetically sealing the electrical element and the optical element.

According to the present disclosure, high-speed signal transmission between an electrical element and an optical element is enabled.

DETAILED DESCRIPTION

[Description of Embodiments of Present Disclosure]

Figure 1:
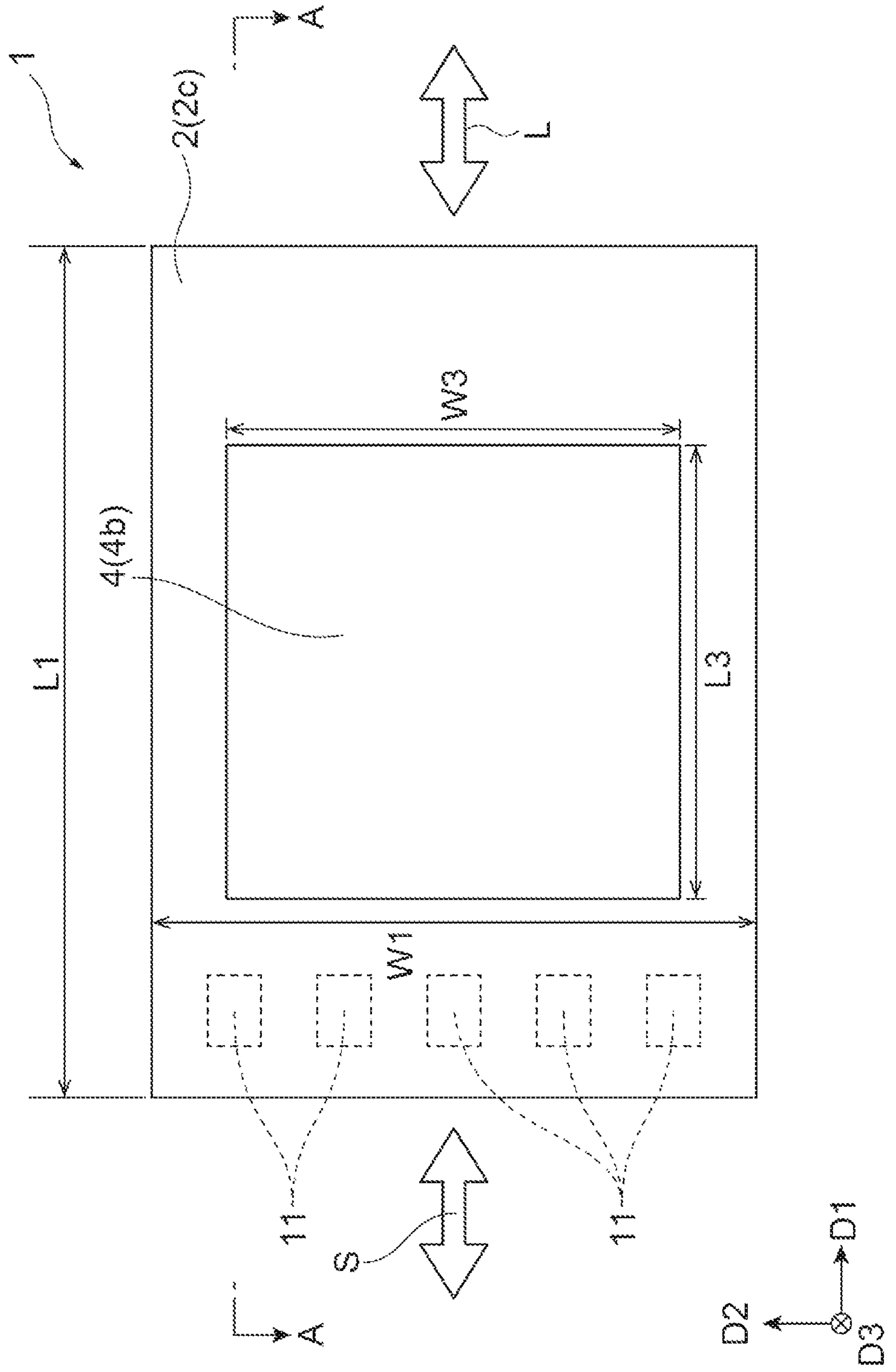
FIG. 1 is a plan view schematically illustrating an optical module according to an embodiment.

First, embodiments of optical modules according to the present disclosure will be listed and described. An optical module according to the embodiment includes: (1) a glass board having a first face, a second face opposite to the first face, and a via penetrating between the first face and the second face. The optical module includes: an electrical element mounted on a first face to process an electrical signal; a heat conduction member mounted on a second face and thermally connected to the electrical element through the via; and an optical element mounted on the first face and converting between the electrical signal and the optical signal. The optical module includes: a temperature control element mounted on the second face and thermally connected to the optical element through the via, and for adjusting the temperature of the optical element; electrical wiring electrically connecting the electrical element to the optical element and constituting the transmission line for transmitting the electrical signal; and a first housing connected to the first face and hermetically sealing the electrical element and the optical element.

This optical module includes a glass board having a first face, a second face, and a via, an optical element, an electrical element, a heat conduction member, and a temperature control element. The electrical elements and the optical elements are mounted on the first face of the board. The optical module includes the first housing connected to the first face and hermetically sealing the electrical element and the optical element. Therefore, since the electrical element and the optical element mounted on the first face of the board are hermetically sealed by the first housing, the electrical element and optical element hermetically sealed can be protected. The board has the via penetrating between the first face and the second face. The electrical element and the heat conduction member can be thermally connected to each other through the via, and the optical element and the temperature control element can be thermally connected to each other. In the optical module, the electrical element and the optical element are mounted on the opposite side of the glass board from the heat conduction member and the temperature control element. Therefore, the glass board with good heat insulation properties can protect the electrical elements and the optical elements from the effects of the stress caused by temperature changes. Furthermore, the optical module includes the electrical wiring electrically connecting the hermetically sealed electrical elements and optical elements to each other. The electrical wiring constitutes the transmission line for transmitting the electrical signal between the electrical element and the optical element. Therefore, since the electrical signal are transmitted between the electrical element and the optical element through the transmission line located in the hermetically sealed space, high-speed signal transmission between the electrical element and the optical element is enabled.

(2) In (1) above, the electrical wiring may be formed on the first face of the board. In this case, since the electrical wiring formed on the first face is hermetically sealed by the first housing, the electrical wiring can be protected.

(3) In (1) above, the optical module may further include a resin layer filled between the electrical element and the optical element, and the electrical wiring may be a metal film formed on the resin layer.

(4) In (1) above, the first face of the board may have a recessed portion. The optical module may further include a resin layer filled in the recessed portion, and the electrical wiring may include a first portion formed on the first face of the board and a second portion formed on the resin layer.

(5) In (4) above, the first portion may be a first wiring formed on the first face, and the second portion may be a second wiring formed on the resin layer. The first wiring and the second wiring may be connected to each other in series.

(6) In any one of (1) to (5) above, the first face of the board may have a recessed portion, and the electrical element and the optical element may be mounted within the recessed portion. In this case, the amount of protrusion of the electrical element and the optical element with respect to the first face can be suppressed.

(7) In (6) above, the recessed portion may include a first recessed portion and a second recessed portion independent of each other. The electrical element may be mounted within the first recessed portion, and the optical element may be mounted within the second recessed portion.

(8) In any one of (1) to (5) above, the first face of the board may have a recessed portion. The electrical element may be mounted within the recessed portion, and the optical element may be mounted outside the recessed portion.

(9) In any one of (1) to (5) above, the first face of the board may have a recessed portion. The optical element may be mounted within the recessed portion, and the electrical element may be mounted outside the recessed portion.

(10) In any one of (1) to (9) above, the via may have the thermal conductivity larger than the thermal conductivity of the board. In this case, heat transfer between the heat conduction member and the electrical element and heat transfer between the temperature control element and the optical element can be performed more efficiently through the via.

(11) In any one of (1) to (10) above, the optical module may further include a second housing mounted on the second face and having the heat radiation member opposite to the second face. The second housing may hermetically seal the heat conduction member and the temperature control element, and the heat conduction member and the temperature control element may be thermally connected to the heat radiation member. In this case, since the heat conduction member and the temperature control element are hermetically sealed by the second housing, the heat conduction member and the temperature control element can be protected. The second housing has the heat radiation member. Therefore, the heat of the heat conduction member and the temperature control element can be radiated through the heat radiation member of the second housing.

[Details of Embodiments of Present Disclosure]

Various examples of optical modules according to embodiments will be described below with reference to the drawings. It is noted that the present invention is not limited to the following examples, but is indicated in the claims, and is intended to include all changes within the scope of equivalency to the claims. In the description of the drawings, the same or corresponding elements are denoted by the same reference numerals, and redundant description will be omitted as appropriate. For ease of understanding, some portions of the drawings may be simplified or exaggerated, and the dimensional ratios and the like are not limited to those illustrated in the drawings.

Figure 2:
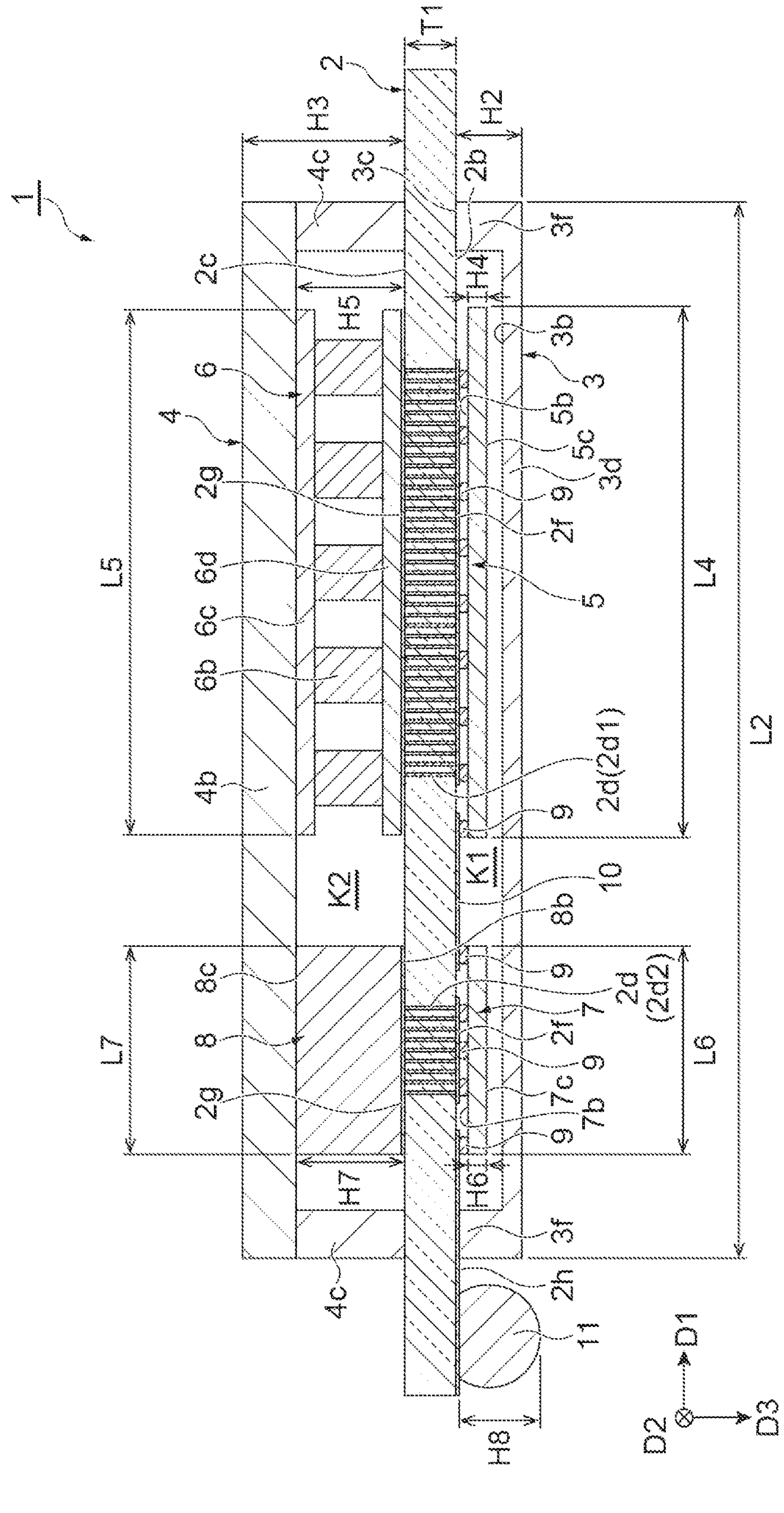
FIG. 2 is a cross-sectional view taken along line A-A in FIG. 1.

FIG. 1 is a plan view schematically illustrating an optical module 1 according to this embodiment. FIG. 2 is a cross-sectional view taken along line A-A in FIG. 1. As illustrated in FIGS. 1 and 2, the optical module 1 includes the board 2, a first housing 3, a second housing 4, an optical element 5, a temperature control element 6, an electrical element 7, and a heat conduction member 8. The optical module 1 is, for example, an optical transmission module that converts the electrical signal into an optical signal and transmits the optical signal to the outside. For example, the optical module 1 is a coherent optical transmission module used for digital coherent optical transmission.

The board 2 is made of glass. For example, the board 2 is a glass interposer. The board 2 extends in a first direction D1 and a second direction D2 intersecting the first direction D1. The board 2 has a thickness in a third direction D3 intersecting both the first direction D1 and the second direction D2. As an example, a length L1 of the board 2 in the first direction D1 is 12 mm, and a length W1 (width of the board 2) of the board 2 in the second direction D2 is 7 mm. A length T1 (thickness of the board 2) of the board 2 in the third direction D3 is, for example, 0.5 mm.

The board 2 is configured with, for example, one of soda lime glass, borosilicate glass, crystallized glass, and quartz glass. For example, a main component of the glass constituting the board 2 is silicon dioxide ($SiO_2$). The board 2 may be a composition containing at least one of sodium (Na) and calcium (Ca). A linear expansion coefficient of the board 2 is, for example, 3 to 5 [ppm/K]. However, the linear expansion coefficient of the board 2 can be made to be 1 [ppm/K] or less or substantially 10 [ppm/K] by adjusting the composition of the material constituting the glass. It is preferable that the linear expansion coefficient of the board 2 has a small difference from a linear expansion coefficient of the optical element 5, a linear expansion coefficient of the temperature control element 6, a linear expansion coefficient of the electrical element 7, and a linear expansion coefficient of the heat conduction member 8, which will be described later. By having the small difference from the linear expansion coefficients, the stress caused by expansion and contraction due to temperature changes can be reduced, and the reliability of the optical element 5 and the electrical element 7 can be improved.

The board 2 has a first face **2*b*, a second face 2*c* opposite to the first face 2*b*, and a via 2*d* penetrating between the first face 2*b* and the second face 2*c*. The board 2 is, for example, a glass board having the via 2*d* that is a through glass via (TGV). The via 2*d* is also referred to as a through via. The via 2*d* functions as, for example, a thermal via. The via 2*d* has, for example, a cylindrical shape extending along the third direction D3. The diameter of the via 2*d* as viewed along the third direction D3 (in the plan view of the board 2) is, for example, 100 μm. In the cross section of the via 2*d* along the third direction D3, the angle of a boundary line between the via 2*d* and the glass surrounding the via 2*d* (a portion of the board 2 other than the via 2*d*) is not necessarily perpendicular to the first face 2*b*, but may be inclined with respect to the first face 2*b*. In this manner, the via 2*d* may extend obliquely in the first direction D1 or the second direction D2 with respect to the first face 2*b***.

The shape of the via **2*d* in the cross section perpendicular to the first face 2*b* may be narrower or may be thicker from the first face 2*b* to the second face 2*c*. Moreover, the shape may become thinner from the first face 2*b* to the center of the board 2 in the third direction D3, and then, may become thicker from the center to the second face 2*c*. The diameter of the via 2*d* represents a maximum value of the diameter in the cross section where the cross-sectional shape of the via 2*d*** is circular.

The board 2 has a plurality of vias **2*d*. The plurality of vias 2*d* include a plurality of first vias 2*d*1 located between the optical element 5 and the temperature control element 6 and a plurality of second vias 2*d*2 located between the electrical element 7 and the heat conduction member 8. Each of the plurality of first vias 2*d*1 and the plurality of second vias 2*d*2 are aligned, for example, along each of the first direction D1 and the second direction D2. For example, in the plan view of the board 2, each of the first vias 2*d*1 and the second vias 2*d*2 are two-dimensionally arranged at a constant pitch. The pitch of the first vias 2*d*1 (distance from the central axis of one first via 2*d*1 to the central axis of the first via 2*d*1 adjacent to the first via 2*d*1) is, for example, 250 μm. The same applies to the second via 2*d*2**.

The first face **2*b* is a face on which the optical element 5 and the electrical element 7 are mounted, and the second face 2*c* is a face on which the temperature control element 6 and the heat conduction member 8 are mounted. The first face 2*b* extends in both the first direction D1 and the second direction D2. The second face 2*c* faces the opposite side of the first face 2*b*, and extends in both the first direction D1 and the second direction D2. The via 2*d* extends along the third direction D3 from the first face 2*b* to the second face 2*c*. The via 2*d*** is filled with metal, for example (also referred to as a filled via).

As a specific example, the via **2*d* is filled with copper (Cu). By allowing the copper filled in the via 2*d* to be in close contact with the surrounding glass portion (portion of the board 2 other than the via 2*d*), the airtightness of the board 2 is ensured between the first face 2*b* and the second face 2*c*. For example, the amount of leakage of the board 2 with the via 2*d* formed therein according to the fine leakage test is less than $1.0\times10^{-9}$ [$Pa\cdot m^3/s$]. Since copper has good thermal conductivity, in the case where the via 2*d* is filled with copper, the via 2*d* can function as a thermal via. The via 2*d* is used for at least one of electrical conduction and thermal conduction between the first face 2*b* and the second face 2*c*. The via 2*d* is referred to as a thermal via especially in the case where the via 2*d* is used for the purpose of heat conduction between the first face 2*b* and the second face 2*c***.

The thermal conductivity of copper (Cu) is substantially 400 [W/(m·K)]. Therefore, in the case where the individual areas and densities of the via **2*d* are adjusted so that the in-plane density of the via 2*d* (ratio of copper in the plurality of vias 2*d* to the glass portion of the board 2 as viewed along the third direction D3) is 10%, even if the thermal conductivity of the glass portion is estimated to be almost zero, which is lower than the actual value, the thermal conductivity of the portion of the via 2*d*** (corresponding to the thermal pad described later) is substantially 40 [W/(m·K)].

The example where the via **2*d* is configured with copper has been described above. However, the via 2*d* may be filled with a semiconductor. As a specific example, the via 2*d* may be filled with silicon (Si). Since a linear expansion coefficient of Si is substantially 4 [ppm/K], a linear expansion coefficient of Cu is substantially 18 [ppm/K], and a linear expansion coefficient of glass is, for example, substantially 3 to 5 [ppm/K], in the case where the via 2*d* is filled with Si, compared to the case where the via 2*d* is filled with Cu, the difference in the linear expansion coefficients with the glass portion around the via 2*d* is small. Therefore, the stress caused by, for example, temperature changes can be reduced. By reducing the stress, the diameter of the via 2***d* can be more increased.

It is noted that the via 2*d* may be formed as a single via having the same shape and substantially the same area as electrodes 2*g* and 2*f* functioning as thermal pads, which will be described later. The inside of the single via may be filled with Si. The single via may have a rectangular shape in the plan view of the board 2. The thermal conductivity of Si is substantially 160 [W/(m·K)], which is smaller than that of Cu. However, by increasing the area of the via, the ratio of the total area of the via to the area of the glass portion of the board 2 can be increased, and the thermal conductivity of the portion of the via 2*d* can be improved. For example, the via 2*d* has the higher thermal conductivity than the thermal conductivity of the board 2 (thermal conductivity of the glass portion of the board 2 other than the via 2*d*).

Among the plurality of vias 2*d*, the first via 2*d*1 is thermally connected to the optical element 5 and the temperature control element 6, and the second via 2*d*2 is thermally connected to the electrical element 7 and the heat conduction member 8. The first via 2*d*1 conducts heat generated in the optical element 5 to the temperature control element 6 more efficiently than the glass portion of the board 2, and the second via 2*d*2 conducts heat generated in the electrical element 7 to the heat conduction member 8 more efficiently than the glass portion of the board 2.

The first housing 3 has a recessed portion 3*b*, and the optical element 5 and the electrical element 7 mounted on the first face 2*b* of the board 2 are accommodated in the recessed portion 3*b*. The first housing 3 is made of, for example, glass. In this case, since the material of the first housing 3 is the same as the material of the glass portion of the board 2, stress on the optical element 5 and the electrical element 7 due to thermal expansion or contraction can be reduced. However, the first housing 3 may be configured with a material other than glass. However, the material of the first housing 3 may be a material having airtightness and heat insulation properties.

For example, the optical element 5 transmits and receives an optical signal L to and from the outside of the optical module 1 through the first housing 3. The optical element 5 performs the conversion between the optical signal L and an electrical signal S, and the electrical element 7 processes the electrical signal S. Specifically, in the case of transmitting the optical signal L, the electrical element 7 amplifies the electrical signal S to generate the drive signal for driving the optical element 5, and the optical element 5 outputs the optical signal L to the outside according to the drive signal. In the case of receiving the optical signal L, the optical element 5 converts the optical signal L received from the outside into the current signal, and the electrical element 7 converts the current signal into the voltage signal and amplifies voltage signal to output the electrical signal S. The optical signal L input to and output from the optical element 5 passes through, for example, the first housing 3. The first housing 3 has, for example, transparency at the wavelength of the optical signal L input to and output from the optical element 5. The wavelength band of the optical signal L is, as an example, 1.2 μm or more and 1.7 μm or less. It is preferable that the first housing 3 has the high transmittance for the optical signal L. For example, the transmittance may be 80% or more.

The recessed portion 3*b* of the first housing 3 is depressed in the third direction D3. The first housing 3 may have a cavity formed in the glass plate as the recessed portion 3*b*. By connecting a connection face 3*c* surrounding the recessed portion 3*b* to the first face 2*b* of the board 2 in the plan view of the board 2 (as viewed along the third direction D3), a first airtight space K1 defined by the recessed portion 3*b* of the first housing 3 and the first face 2*b* of the board 2 is formed.

The first airtight space K1 accommodates the optical element 5 and the electrical element 7 mounted on the first face 2*b*. It is preferable that the difference in a linear expansion coefficient of the first housing 3 and the linear expansion coefficient of the board 2 is small. This small difference in the linear expansion coefficients can reduce the stress occurred due to temperature changes in the optical module 1. A length L2 of the first housing 3 in the first direction D1 is smaller than the length L1 of the board 2 in the first direction D1. The length of the first housing 3 in the second direction D2 is smaller than the length W1 of the board 2 in the second direction D2.

For example, the first housing 3 has a bottom portion 3*d* extending in both the first direction D1 and the second direction D2 and a side wall portion 3*f* extending from the bottom portion 3*d* in the third direction D3. As an example, the length L2 of the first housing 3 in the first direction D1 is 10 mm, and the length of the first housing 3 in the second direction D2 is 5 mm. A height H2 (length in the third direction D3) of the first housing 3 is, for example, 0.3 mm. For example, the bottom portion 3*d* and the side wall portion 3*f* are portions of a single part (a bulk body). However, the bottom portion 3*d* and the side wall portion 3*f* may be separate bodies, or the first housing 3 may be configured by bonding the side wall portion 3*f* to the bottom portion 3*d* having the cavity. In the plan view of the board 2, the side wall portion 3*f* has a shape surrounding the recessed portion 3*b*. That is, the recessed portion 3*b* is formed inside the side wall portion 3*f*. By using glass with the optically polished surface for the side wall portion 3*f*, optical coupling through the first housing 3 described above can be easily realized. In this case, the bottom portion 3*d* may be opaque for the optical signal L.

The first housing 3 is bonded (sealed) to the board 2 via, for example, an adhesive (also referred to as a sealant). This adhesive is configured with, for example, metal. As a specific example, the adhesive is configured with gold-tin (AuSn). In this case, the first housing 3 is bonded to the board 2 by heating and melting gold-tin applied to the connection face 3*c*. At this time, the connection face 3*c* of the first housing 3 and the connection portion of the board 2 connected to the connection face 3*c* are metalized, for example, with metal. For example, the connection face 3*c* and the glass surface of the connection portion of the board 2 are metalized with gold (Au). The highly airtight first airtight space K1 is formed by metal bonding. For example, the amount of leakage in the first airtight space K1 according to the fine leakage test is less than $1.0\times10^{-9}$ [$Pa\cdot m^3/s$]. Accordingly, the reliability of the optical element 5 and the electrical element 7 can be further improved. Heat melting is performed by, for example, laser irradiation or heater heating.

The first housing 3 may have transparency at the wavelength of a heating laser beam. For example, the first housing 3 may have the transmittance of 80% or more at the wavelength of the laser beam. In this case, the adhesive can be heated by irradiating with the laser beam from the opposite side of the board 2 so as to pass through the first housing 3. Accordingly, the highly airtight first airtight space K1 can be formed. In addition to the above-mentioned gold-tin, solder, glass frit, or epoxy resin may be used as the adhesive for bonding the first housing 3 and the board 2.

Alternatively, for example, a face oxide film ($SiO_2$) of the first housing 3 and the face oxide film of the board 2 may be directly bonded without using the adhesive. Alternatively, a top surface on which oxide film and metal film are formed may be directly bonded to another top surface on which the oxide film and the metal film are formed (also called as hybrid bonding). In the case where the insulator is used as the adhesive and in the case where the bonding is performed by hybrid bonding, the first airtight space K1 is hermetically sealed, and the electrical wiring (feed-through) connecting the first airtight space K1 and the outside of the first housing 3 can be formed.

The second housing 4 is connected to the second face 2*c* of the board 2. The second housing 4 accommodates the temperature control element 6 and the heat conduction member 8 mounted on the second face 2*c* of the board 2. The second housing 4 is connected to the second face 2*c* and hermetically seals the temperature control element 6 and the heat conduction member 8. The second housing 4 includes, for example, a heat radiation member 4*b* extending in both the first direction D1 and the second direction D2 and a side wall portion 4*c* extending from the heat radiation member 4*b* in the third direction D3.

The heat radiation member 4*b* has the higher thermal conductivity than the thermal conductivity of the board 2. The heat radiation member 4*b* has a plate shape. The heat radiation member 4*b* is configured with, for example, silicon (Si). The side wall portion 4*c* is configured with, for example, glass. However, the material of the heat radiation member 4*b* and the material of the side wall portion 4*c* are not limited to the above examples. For example, the heat radiation member 4*b* may be configured with metal. Further, the side wall portion 4*c* may be configured with ceramic.

The heat radiation member 4*b* functions as a heat transfer path located between each of the temperature control element 6 and the heat conduction member 8 and the outside of the optical module 1. For example, the heat radiation member 4*b* is bonded to the side wall portion 4*c* through the adhesive. For example, in the second housing 4, the heat radiation member 4*b* configured with silicon (Si) and the side wall portion 4*c* configured with glass are integrated with each other through the adhesive. It is preferable that the difference in a linear expansion coefficient of the heat radiation member 4*b* and the linear expansion coefficient of the board 2 is small. Since the difference in the linear expansion coefficients is small, the stress caused by temperature changes in the optical module 1 can be reduced.

For example, a length L3 of the second housing 4 in the first direction D1 is smaller than the length L1 of the board 2 in the first direction D1. A length W3 of the second housing 4 in the second direction D2 is smaller than the length W1 of the board 2 in the second direction D2. As an example, the length L3 of the second housing 4 in the first direction D1 is the same as the length L2 of the first housing 3 in the first direction D1, and the length W3 of the second housing 4 in the second direction D2 is the same as the length of the first housing 3 in the second direction D2. In this case, the length L3 of the second housing 4 in the first direction D1 is 10 mm, and the length W3 of the second housing 4 in the second direction D2 is 5 mm. For example, a height H3 (length in the third direction D3) of the second housing 4 is larger than the height H2 of the first housing 3. As an example, the height H3 of the second housing 4 is 1.5 mm.

A second airtight space K2 is formed between the board 2 and the second housing 4. The second face 2*c* of the board 2, the side wall portion 4*c* and the heat radiation member 4*b* of the second housing 4 define the second airtight space K2. For example, the volume of the first airtight space K1 of the first housing 3 is smaller than the volume of the second airtight space K2 of the second housing 4. For example, the first airtight space K1 is more airtight than the second airtight space K2. For example, the amount of leakage from the first housing 3 is smaller than the amount of leakage from the second housing 4.

The second housing 4 is bonded to the board 2 through, for example, the adhesive. As an example, the first housing 3 is bonded to the board 2 via gold-tin (AuSn), and the second housing 4 is bonded to the board 2 through the resin adhesive. For example, the second housing 4 is bonded to the board 2 through an ultraviolet curing resin. In this case, the second airtight space K2 may be less airtight than the first airtight space K1. However, the airtightness of the second airtight space K2 may be less than the airtightness of the first airtight space K1. As an example, the amount of leakage in the second airtight space K2 according to the fine leakage test may be less than $1.0\times10^{-9}$ [Pa·m$^3$/s]. In this case, the occurrence of dew condensation on the temperature control element 6 and the heat conduction member 8 accommodated in the second airtight space K2 can be suppressed, and the reliability of the temperature control element 6 and the heat conduction member 8 can be improved.

Solder, glass frit, or epoxy resin may be used as the adhesive to bond the second housing 4 and the board 2. Alternatively, for example, the surface oxide film ($SiO_2$) on the bonding face of the side wall portion 4*c* and the surface oxide film on the second face 2*c* of the board 2 may be directly bonded without using the adhesive, and the surfaces where the oxide film and the metal are formed may be bonded by hybrid bonding. In the case where the insulator is used as the adhesive and in the case where the bonding is performed by hybrid bonding, the second airtight space K2 is hermetically sealed, and the electrical wiring connecting the second airtight space K2 and the outside of the second housing 4 can be formed. It is noted that the moisture absorbing material that adsorbs moisture or the decomposing agent that decomposes moisture may be arranged in the second airtight space K2. In the second airtight space K2, although condensation occurs in the case where the second airtight space K2 is low airtight, the surfaces of the board 2, the second housing 4, the temperature control element 6, and the heat conduction member 8 may be protected (covered) with the insulating film such as resin so that moisture does not enter into the inside.

For example, the optical element 5 is a light modulator. As an example, the optical element 5 is an IQ optical modulator. The optical element 5 is configured with, for example, indium phosphide (InP). In this case, the linear expansion coefficient of the optical element 5 is substantially 4.6 [ppm/K]. As an example, a length L4 of the optical element 5 in the first direction D1 is 4 mm, and the length of the optical element 5 in the second direction D2 is 4 mm. A thickness (length in the third direction D3) H4 of the optical element 5 is, for example, 0.1 mm. The optical element 5 is flip-chip-mounted (also referred to as face-down-mounted) to the board 2 in the first airtight space K1 so that a circuit face (first face) 5*b* faces the board 2. For this flip-chip-mounting, for example, thermocompression bonding or ultrasonic bonding is used. The circuit face indicates a face on which the circuit layer is formed, and the face opposite to the circuit face is referred to as a substrate face.

It is noted that the optical element 5 may be an optical element other than an optical modulator. For example, the optical element 5 may be a semiconductor laser or a light reception element. As an example, the semiconductor laser is configured with a laser diode, and the light reception element is configured with a photodiode. For example, the optical element 5 has the first face 5*b* (circuit face) facing the board 2, and a second face 5*c* (substrate face) facing the opposite side of the first face 5*b*. The circuit face is a face on which components of the optical circuit such as an optical waveguide, an optical splitter, or an optical coupler are formed. An epitaxial layer may be formed on the circuit face, or an active element may be formed on the circuit face. Generally, no optical circuit components are formed on the substrate face. However, passive elements such as electrodes or lenses may be formed on the substrate face.

For example, the optical element 5 has the electrode (pad) formed on the first face 5*b*, and the electrode is electrically and thermally connected to the electrode 2*f* and the via 2*d* formed on the first face 2*b* of the board 2 through a bump 9. For example, the electrode formed on the first face 5*b* may be the pad configured with gold (Au). For example, the bump 9 is a solder bump, an Au stud bump, or a micro-bump with a solder cap placed on a Cu pillar. The underfill resin may be filled between the board 2 and the optical element 5.

For example, since the side (second face 5*c*) of the optical element 5 opposite side of the board 2 is surrounded by gas, the opposite side is thermally floated (state where heat is blocked from flowing in and out from the surroundings). On the other hand, the optical element 5 is thermally connected to the temperature control element 6 through the via 2*d* of the board 2. Therefore, the optical element 5 is less susceptible to the effects of heat from the first housing 3, and the temperature is efficiently controlled by the temperature control element 6. For example, the thermal resistance between the optical element 5 and the temperature control element 6 is lower than the thermal resistance between the optical element 5 and the first housing 3 by one order of magnitude or more. In the state where the second housing 4 is bonded to the board 2, the heat radiation member 4*b* is located on the opposite side of the second face 2*c* as viewed from the temperature control element 6.

The temperature control element 6 is interposed between the heat radiation member 4*b* and the board 2. The temperature control element 6 is thermally connected to the heat radiation member 4*b*. The temperature control element 6 is, for example, a thermoelectric cooler. For example, the temperature control element 6 includes a plurality of Peltier elements 6*b*, and a first board 6*c* and a second board 6*d* interposing the plurality of Peltier elements 6*b* in the third direction D3. The first board 6*c* and the second board 6*d* are, for example, ceramic boards. The first board 6*c* is in contact with the heat radiation member 4*b*. The second board 6*d* is connected to the via 2*d* through the electrode 2*g* formed on the second face 2*c* of the board 2.

It is noted that the electrode other than the electrode 2*g* is formed on the second face 2*c* of the board 2, and the electrical terminal of the temperature control element 6 is electrically connected to the electrode by, for example, wire bonding, so that electrical power can be supplied to the temperature control element 6. Further, for example, a thermistor may be arranged on the second face 2*c* or the first face 2*b* of the board 2, and this thermistor may be used as a monitor for temperature measurement. The circuit face of the optical element 5 is fixed to the board 2 and connected to the temperature control element 6 through the board 2. On the other hand, the substrate face of the optical element 5 is not in contact with any other component (solid). Therefore, compared to the configuration in which both the circuit face and the substrate face are fixed, the effects of the stress on the optical element 5 due to temperature changes can be suppressed.

More specifically, in the case where the optical element 5 is interposed between the temperature control element 6 and the board 2 in the second airtight space K2 (optical element 5 is mounted on the board 2 so that the circuit face faces the second face 2*c* of the board 2, and the temperature control element 6 is mounted on the substrate face of the optical element 5), since the second housing 4, the temperature control element 6, the optical element 5 and the board 2 expand or contract according to the linear expansion coefficients of the respective components, due to the temperature changes, the large stress may be likely to be applied to the optical element 5. However, in this embodiment, since only the circuit face of the optical element 5 is fixed, the thermal stress applied to the optical element 5 can be reduced. Accordingly, the reliability of the optical element 5 is improved.

The electrodes 2*f* and 2*g* of the board 2 are formed, for example, by plating the surface of copper (Cu) with gold (Au). The electrodes 2*f* and 2*g* may be formed by plating, for example, nickel (Ni) or palladium (Pd) between the gold plating and the copper. The electrodes 2*f* and 2*g* may be pads (thermal pads) covering the plurality of vias 2*d*. That is, the electrodes 2*f* and 2*g* may be thermal pads including the via 2*d* in the plan view of the board 2. This thermal pad is, for example, a thin film configured with copper. The heat conduction material (thermal interface material (TIM)) may be interposed between the first board 6*c* and the heat radiation member 4*b* or between the second board 6*d* and the electrode 2*g*. This heat conduction material is configured with, for example, metal paste, solder, or resin. As an example, a length L5 of the temperature control element 6 in the first direction D1 is 4 mm, and the length of the temperature control element 6 in the second direction D2 is 4 mm. For example, a thickness H5 (length in the third direction D3) of the temperature control element 6 is 1 mm.

The electrical element 7 is, for example, a driver IC driving the optical element 5. The electrical element 7 may be a transimpedance amplifier voltage-converting and amplifying the output of the optical signal L from the optical element 5, which is a photodiode. The electrical element 7 amplifies the electrical signal input through the electrode formed on a first face 7*b* to generate the drive signal, outputs the drive signal to the optical element 5, and drives the optical element 5. Further, the electrical element 7 may include both the above driver circuit and the above transimpedance amplifier.

The electrical element 7 is, for example, a semiconductor circuit component formed by an SiGe BiCMOS process. A length L6 of the electrical element 7 in the first direction D1 is 2 mm, and the length of the electrical element 7 in the second direction D2 is 4 mm. A length H6 (thickness) of the electrical element 7 in the third direction D3 is 0.1 mm. The electrical element 7 is flip-chip-mounted (face-down mounted) on the board 2 in the first airtight space K1. In flip-chip-mounting, for example, thermocompression bonding or ultrasonic bonding is performed.

The electrical element 7 has the first face 7*b* (circuit face) facing the board 2 and a second face 7*c* (substrate face) facing the opposite side of the first face 7*b*. The electrical element 7 is mounted on the board 2 so that the first face 7*b* faces the board 2. For example, the electrical element 7 has the electrode formed on the first face 7*b*, and the electrode is electrically and thermally connected to the electrode 2*f* and the via 2*d* formed on the first face 2*b* of the board 2 through the bump 9. The electrode of the electrical element 7 is, for example, a pad configured with aluminum (Al). The underfill resin may be filled between the electrical element 7 and the board 2.

For example, the side of the electrical element 7 opposite side of the board 2 (second face 7*c*) is surrounded by gas and is therefore thermally floated. On the other hand, the electrical element 7 is thermally connected to the heat conduction member 8 through the via 2*d* of the board 2. Therefore, the heat emitted from the electrical element 7 is hardly transmitted to the first housing 3 and is mostly transmitted to the heat conduction member 8. In the state where the second housing 4 is bonded to the board 2, the heat radiation member 4*b* of the second housing 4 is located on the opposite side of the second face 2*c* as viewed from the heat conduction member 8.

The heat conduction member 8 is, for example, a heat radiation block. The heat conduction member 8 is interposed between the heat radiation member 4*b* and the board 2. The heat conduction member 8 is thermally connected to the heat radiation member 4*b*. The heat conduction member 8 is made of, for example, aluminum nitride (AlN). The heat conduction member 8 has, for example, a first face 8*b* in contact with the electrode 2*g* of the board 2, and a second face 8*c* in contact with the heat radiation member 4*b*. The heat conduction material may be interposed at least one of between the first face 8*b* and the electrode 2*f* and between the second face 8*c* and the heat radiation member 4*b*. For example, a length L7 of the heat conduction member 8 in the first direction D1 is 2 mm, and the length of the heat conduction member 8 in the second direction D2 is 4 mm. A length H7 (thickness) of the heat conduction member 8 in the third direction D3 is 1 mm.

The circuit face of the electrical element 7 is fixed to the board 2 and connected to the heat conduction member 8 through the board 2. Therefore, the heat of the electrical element 7 can be released to the outside of the optical module 1. The electrode of the electrical element 7 is electrically connected to the electrode 2*f* of the board 2, and the electrical element 7 and the heat conduction member 8 are thermally connected to each other through the electrodes 2*f* and 2*g* and the via 2*d*. In contrast, the substrate face of the electrical element 7 is not in contact with any other solid component. Therefore, compared to the configuration in which both the circuit face and the substrate face are fixed, the effects of the stress on the electrical element 7 due to temperature changes can be suppressed.

In the case where the electrical element 7 is interposed between the heat conduction member 8 and the board 2 in the second airtight space K2 (in the case where the electrical element 7 is mounted on the board 2 so that the circuit face faces the second face 2*c* of the board 2, and the heat conduction member 8 is mounted on the substrate face of the electrical element 7), the second housing 4, the heat conduction member 8, the electrical element 7, and the board 2 expand or contract according to the linear expansion coefficients of the respective components, due to the temperature changes, the large stress may be applied to the electrical element 7. However, in this embodiment, since only the circuit face of the electrical element 7 is fixed, the thermal stress applied to the electrical element 7 can be reduced. Accordingly, the reliability of the electrical element 7 can be improved.

The optical module 1 includes electrical wiring 10 electrically connecting the electrical element 7 to the optical element 5. The electrical wiring 10 is electrically connected to the electrode formed on the first face 5*b* of the optical element 5 through the bump 9 and is also electrically connected to the electrode formed on the first face 7*b* of the electrical element 7 through the bump 9. The electrical wiring 10 constitutes the transmission line for transmitting the electrical signal between the electrical element 7 and the optical element 5. The electrical wiring 10 includes, for example, signal wiring for transmitting high-speed signals (high-frequency signals).

The electrical wiring 10 is formed on the first face 2*b* of the board 2. The transmission line is configured with the electrical wiring 10, and the characteristic impedance of the transmission line is appropriately designed, so that the optical element 5 can be separated from the electrical element 7 by a distance (for example, by 1 mm). In this case, by increasing the thermal resistance of the electrical wiring 10, the flow of heat from the electrical element 7 to the optical element 5 can be reduced. Furthermore, by configuring the transmission line with the electrical wiring 10, the effects of parasitic inductance of the electrical wiring can be reduced compared to wire bonding connection.

Figure 3:
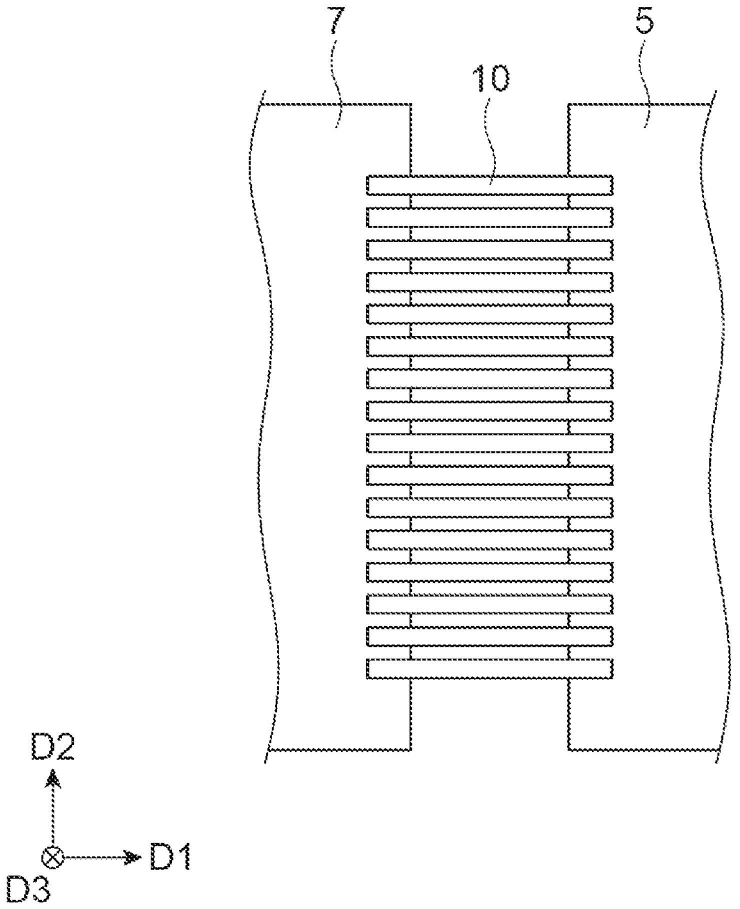
FIG. 3 is a diagram illustrating electrical wiring of the optical module of FIG. 2.

FIG. 3 is a diagram illustrating the electrical wiring 10 connecting the optical element 5 and the electrical element 7 to each other. As illustrated in FIGS. 2 and 3, the electrical wiring 10 extends along the first direction D1. The plurality of electrical wirings 10 are formed on the board 2, and the plurality of electrical wirings 10 are aligned along the second direction D2. For example, the plurality of electrical wirings 10 are aligned at equal intervals along the second direction D2. The interval (pitch) of the electrical wiring 10 is, for example, 100 μm.

The width of the electrical wiring 10 is, for example, 95 μm. The distance between the two electrical wirings 10 adjacent to each other along the second direction D2 is, for example, 5 μm. In this manner, the plurality of electrical wirings 10 are formed on the board 2 with the high density. Therefore, the electrical connection between the optical element 5 and the electrical element 7 can be performed with high density. For example, a specific dielectric constant of the board 2 is lower than that of ceramic. As an example, the specific dielectric constant of the board 2 is 5.5. In this case, the cutoff frequency at which stable signal transmission is enabled in the electrical wiring 10 can be allowed to be higher than that of the ceramic package. Therefore, the optical module 1 can be used up to the higher frequency band (for example, 100 GHz or more).

The signals transmitted through the electrical wiring 10 are configured with, for example, differential signals. As an example, the signals transmitted through the electrical wiring 10 are configured with 4 channels of differential signals. The number of electrical wirings 10 is, for example, 16 in total for 4 channels. The electrical wiring 10 is, for example, a GSSG (ground signal signal ground) line. However, the electrical wiring 10 may be a GSGSG (ground signal ground signal ground) line. The electrical wiring 10 is, for example, a differential microstrip line or a coplanar line designed as a single layer of Cu wiring. By using single layer, the thermal resistance of the electrical wiring 10 described above can be increased. The characteristic impedance of the differential microstrip line or coplanar line may match with, for example, termination resistance of the optical modulator (optical element 5) for impedance matching, and for example, the differential impedance is 50 to 60Ω.

The thickness of the Cu wiring is, for example, 3 μm. The thermal conductivity of copper (Cu) is substantially 400 [W/(m·K)], the cross-sectional area of the electrical wiring 10 is 285 $\mu m^2$ (width 95 μm×thickness 3 μm), and assuming that the distance from the optical element 5 to the electrical element 7 is 1 mm, the total thermal resistance of the 16 electrical wirings 10 is substantially 550 [K/W]. Assuming that the thermal conductivity of the glass is substantially 1 [W/(m·K)], since the length of the optical element 5 and the electrical element 7 in the second direction D2 is 4 mm, the thickness of the board 2 is 0.5 mm, and the distance from the optical element 5 to the electrical element 7 is 1 mm, the thermal resistance of the glass portion of the board 2 from the optical element 5 to the electrical element 7 is substantially 500 [K/W]. For this reason, the parallel thermal resistance from the optical element 5 to the electrical element 7 is substantially 260 [K/W]. This parallel thermal resistance is equal to or more than 150 times higher than the thermal resistance of the thermal via (via 2*d*) of the board 2 thermally connected to the electrical element 7 which is a heating element (thermal resistance of substantially 1.6 [K/W] is obtained from the area of the electrical element 7 of 4 mm×2 mm, the thickness of the board 2 of 0.5 mm, and the thermal conductivity of the portion of the via 2*d* of 40 [W/(m·K)]). Therefore, the flow of heat between the optical element 5 and the electrical element 7 can be effectively reduced.

The electrical wiring 10 has been described above. However, the configuration of the electrical wiring 10 is not limited to the above example, but can be changed as appropriate. For example, the electrical wiring 10 may be a grounded coplanar line designed as a two-layer Cu wiring. Further, the optical module 1 may have a power line or a control line (relatively low-speed electrical signal) other than the electrical wiring 10 between the optical element 5 and the electrical element 7. Further, the optical module 1 may include a shield (a metal cover connected to a ground potential) on the outside of the first housing 3, for example, as the countermeasure against EMI.

For example, the optical module 1 has a terminal 11 for external connection. The terminal 11 is a terminal for surface mounting provided on the first face 2*b* of the board 2. The face of the board 2 on which the terminals 11 for surface mounting are provided is also referred to as a mounting face. A height H8 (length in the third direction D3) of the terminal 11 with respect to the first face 2*b* is larger than the height H2 of the first housing 3 with respect to the first face 2*b*. As an example, the terminal 11 is a spherical solder ball. The diameter of the terminal 11 is, as an example, 400 μm. The terminal 11 is, for example, Sn—Ag—Cu alloy solder.

The terminal 11 is connected to electrical wiring 2*h* formed on the first face 2*b* of the board 2. The surface of the electrical wiring 2*h* may be protected by a passivation film. In that case, the electrode (pad) with exposed metal is formed in the portion of the electrical wiring 2*h* connected to the terminal 11. The surface of the electrode may be plated with under bump metal. The electrical wiring 2*h* is electrically connected to the electrode formed on the first face 7*b* of the electrical element 7 through the bump 9. The optical module 1 has the plurality of terminals 11, and the plurality of terminals 11 are aligned, for example, along the second direction D2. It is noted that the terminals 11 may be arranged in an array shape. For example, the plurality of terminals 11 constitute the BGA (ball grid array).

The terminal 11 and the electrical wiring 2*h* are used, for example, to input and output the electrical signal S, which is the high-speed signal (high frequency signal), to the electrical element 7. The signals transmitted through the terminals 11 and the electrical wiring 2*h* are configured by, for example, differential signals. As an example, the signals transmitted through the terminal 11 and the electrical wiring 2*h* are configured with 4ch differential signals. The number of electrical wirings 2*h* is, for example, 16 in total for 4 channels. The electrical wiring 2*h* is, for example, a GSSG (ground signal signal ground) line. However, the electrical wiring 2*h* may be a GSGSG (ground signal ground signal ground) line. The electrical wiring 2*h* is, for example, a differential microstrip line or a coplanar line designed as a single layer of Cu wiring. The impedance of the differential microstrip line or the coplanar line may match with, for example, the termination resistance of the electrical element 7 to which the electrical wiring 2*h* is connected for impedance matching, and for example, a differential impedance is 100Ω.

The interval (pitch) of the electrical wiring 2*h* is, for example, 100 μm. The width of the electrical wiring 2*h* is, for example, 80 μm. The distance between two electrical wirings 2*h* that are adjacent to each other along the second direction D2 is, for example, 20 μm. In this manner, the plurality of electrical wirings 2*h* are formed on the board 2 with high density. Therefore, the electrical connection between the electrical element 7 and the outside of the optical module 1 can be performed with high density. For example, the specific dielectric constant of the board 2 is lower than that of ceramic. As an example, the specific dielectric constant of the board 2 is 5.5. In this case, the cutoff frequency at which stable signal transmission is enabled in the electrical wiring 2*h* can be allowed to be higher than that of a ceramic package. Therefore, the optical module 1 can be used up to a higher frequency band (for example, 100 GHz or more).

In order to transmit high-speed signals, the terminal 11 may be a micro-bump. For example, as the terminal 11, a C4 (controlled collapse chip connection) bump configured with solder or the copper (Cu) pillar with solder formed at the tip can be used. For example, the diameter of the C4 bump is 100 μm. For example, the diameter of the Cu pillar is 40 μm, the height of the Cu pillar is 50 μm. In the case where the micro-bump such as the C4 bump or the Cu pillar is used for the terminal 11, since the size becomes smaller than the case where the BGA solder ball is used for the terminal 11, the parasitic capacitance and the parasitic inductance are also reduced, and thus, high-frequency signals can be transmitted. However, in the case where the micro-bump is used for the terminals 11, the height H8 of the terminals 11 becomes smaller than the height H2 of the first housing 3. Therefore, in the case of mounting the optical module 1 on the separate board, the recessed portion or the through hole may be provided at the position where the first housing 3 faces.

Next, the function and effects obtained from the optical module 1 according to this embodiment will be described. The optical module 1 includes the glass board 2 having the first face 2*b*, the second face 2*c*, and the via 2*d*, the optical element 5, the electrical element 7, the heat conduction member 8, and the temperature control element 6. The electrical element 7 and the optical element 5 are mounted on the first face 2*b* of the board 2. The optical module 1 includes the first housing 3 connected to the first face 2*b* and hermetically sealing the electrical element 7 and the optical element 5. Therefore, since the electrical element 7 and the optical element 5 mounted on the first face 2*b* of the board 2 are hermetically sealed by the first housing 3, the electrical element 7 and the optical element 5 can be protected. The board 2 has the via 2*d* penetrating between the first face 2*b* and the second face 2*c*. The electrical element 7 and the heat conduction member 8 can be thermally connected to each other through the via 2*d*, and the optical element 5 and the temperature control element 6 can be thermally connected to each other.

In the optical module 1, the electrical element 7 and the optical element 5 are mounted on the opposite side of the heat conduction member 8 and the temperature control element 6 as viewed from the glass board 2. Therefore, the glass board 2 with good heat insulation properties can protect the electrical element 7 and the optical element 5 from the affects effects of the stress caused by temperature changes. Furthermore, the optical module 1 includes the electrical wiring 10 electrically connecting the hermetically sealed electrical element 7 and optical element 5 to each other. The electrical wiring 10 constitutes the transmission line for transmitting the electrical signal between the electrical element 7 and the optical element 5. Therefore, since the electrical signal is transmitted between the electrical element 7 and the optical element 5 through the electrical wiring 10 in the hermetically sealed space, high-speed signal transmission between the electrical element 7 and the optical element 5 is enabled.

As mentioned above, the via **2*d* may have the higher thermal conductivity than the thermal conductivity of the board 2. In this case, heat transfer between the heat conduction member 8 and the electrical element 7, and heat transfer between the temperature control element 6 and the optical element 5 can be performed more efficiently through the via 2*d***.

As described above, the optical module 1 may further include the second housing 4 mounted on the second face **2*c* and having the heat radiation member 4*b* opposite to the second face 2*c*. The second housing 4 may hermetically seal the heat conduction member 8 and the temperature control element 6, and the heat conduction member 8 and the temperature control element 6 may be thermally connected to the heat radiation member 4*b*. In this case, since the heat conduction member 8 and the temperature control element 6 are hermetically sealed by the second housing 4, the heat conduction member 8 and the temperature control element 6 can be protected. The second housing 4 has the heat radiation member 4*b*. Therefore, the heat of the heat conduction member 8 and the temperature control element 6 can be radiated to the outside through the heat radiation member 4*b* of the second housing 4**.

Figure 4:
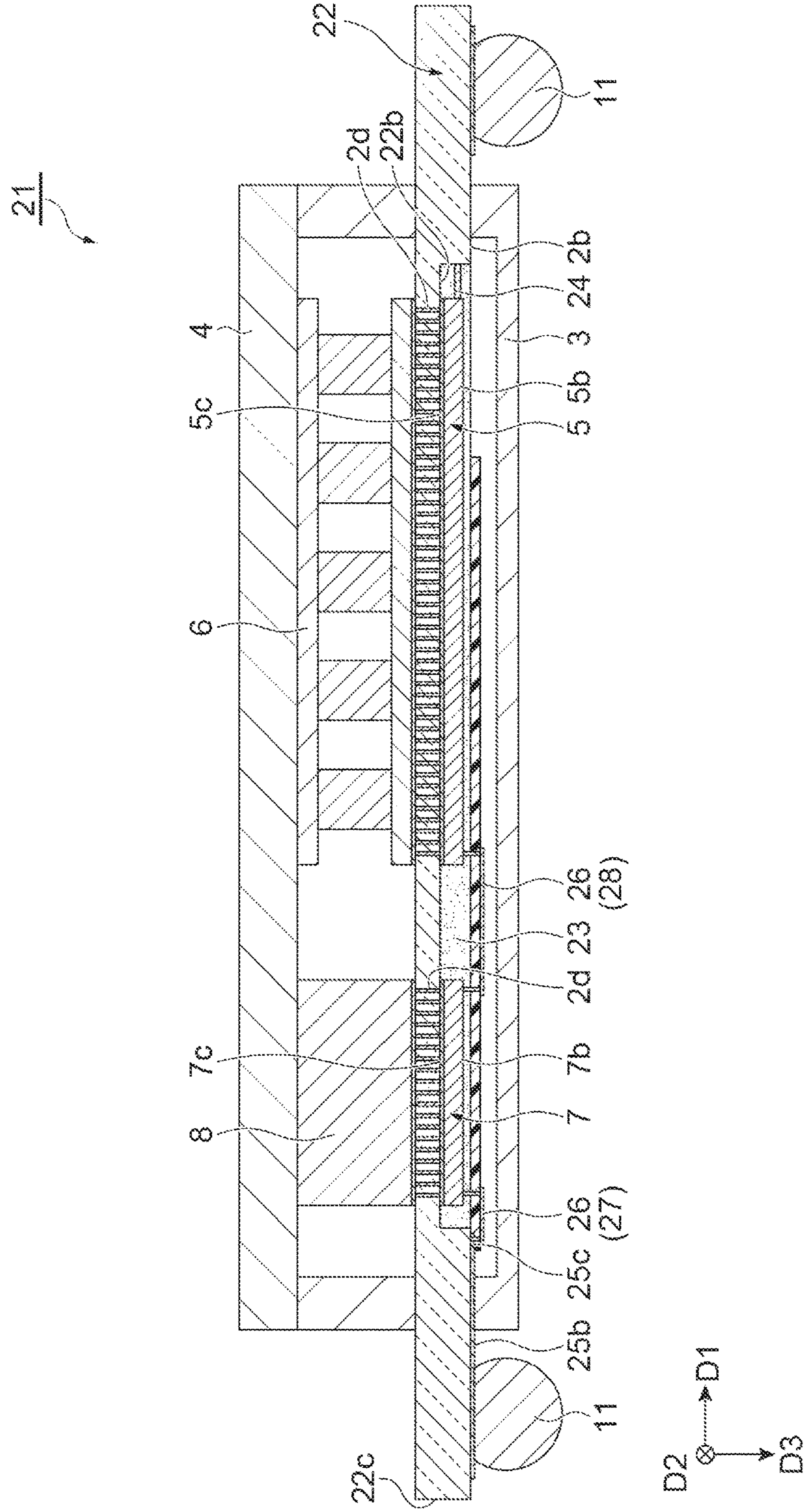
FIG. 4 is a cross-sectional view illustrating an optical module according to Modified Example 1.

Next, optical modules according to various modified examples will be described. A portion of the configuration of the optical module according to Modified Examples described later is the same as the portion of the configuration of the optical module 1 described above. Therefore, in the following description, descriptions overlapping with those already denoted will be denoted by the same reference numerals and omitted as appropriate. FIG. 4 is a cross-sectional view illustrating an optical module 21 according to Modified Example 1. In the embodiments described above, face-down mounting (flip-chip-mounting) has been described in which the optical element 5 has the electrode formed on the first face **5*b* and the electrode is thermally connected to the via 2*d* of the board 2. In the embodiment described above, the electrical element 7 has been also face-down mounted (flip-chip-mounted) like the optical element 5. On the other hand, in the optical module 21, the optical element 5 is mounted on a board 22 so that the first face 5*b* (circuit face) faces the opposite side of the via 2*d* of the board 22, the electrical element 7 is mounted on the board 22 so that the first face 7*b* (circuit face) faces the opposite side of the via 2*d* of the board 22, and both the optical element 5 and the electrical element 7** are mounted face-up.

The optical module 21 includes the board 22 in which a recessed portion **22*b* is formed on the first face 2*b*. The board 22 is different from the board 2 described above in that the board 22 has the recessed portion 22*b*. The first face 2*b* of the board 22 has the recessed portion 22*b*, and the electrical element 7 and the optical element 5 are mounted within the recessed portion 22*b*. Accordingly, the amount of protrusion of the electrical element 7 and the optical element 5 in the third direction D3 with respect to the first face 2*b* can be suppressed. A bottom face of the recessed portion 22*b* and the second face 5*c* (substrate face) of the optical element 5 face each other, and the bottom face of the recessed portion 22*b* and the second face 7*c* (substrate face) of the electrical element 7** face each other.

For example, each of the second face **5*c* of the optical element 5 and the second face 7*c* of the electrical element 7 is adhesively fixed to the bottom face of the recessed portion 22*b* through the adhesive. The adhesive is, for example, silver paste. By mounting the optical element 5 and the electrical element 7 in the recessed portion 22*b*, the height of the first housing 3 with respect to the first face 2*b* can be suppressed to be low. The recessed portion 22*b* is formed on the first face 2*b* by, for example, cutting or etching. The recessed portion 22*b* is depressed in the third direction D3 on the first face 2*b***.

The optical module 21 includes a resin layer 23 filled between the optical element 5 and the electrical element 7. The resin layer 23 fills the recessed portion **22*b* of the board 22. The optical module 21 has a resin waveguide 24 extending from the optical element 5 to the board 22 in the resin layer 23. The resin waveguide 24 is configured with resin. The optical element 5 transmits and receives the optical signal L to and from the outside of the optical module 1 through, for example, the resin waveguide 24 and the board 22. The resin waveguide 24 functions as a core through which the optical signal L passes, and the resin layer 23 functions as a clad located around the resin waveguide 24. The resin waveguide 24 and the resin layer 23 may have transparency in the wavelength band (wavelength band of the optical signal L) used by the optical module 1. For example, the resin waveguide 24 and the resin layer 23** may have the transmittance of 80% or more in the wavelength band of the optical signal L.

Figure 5:
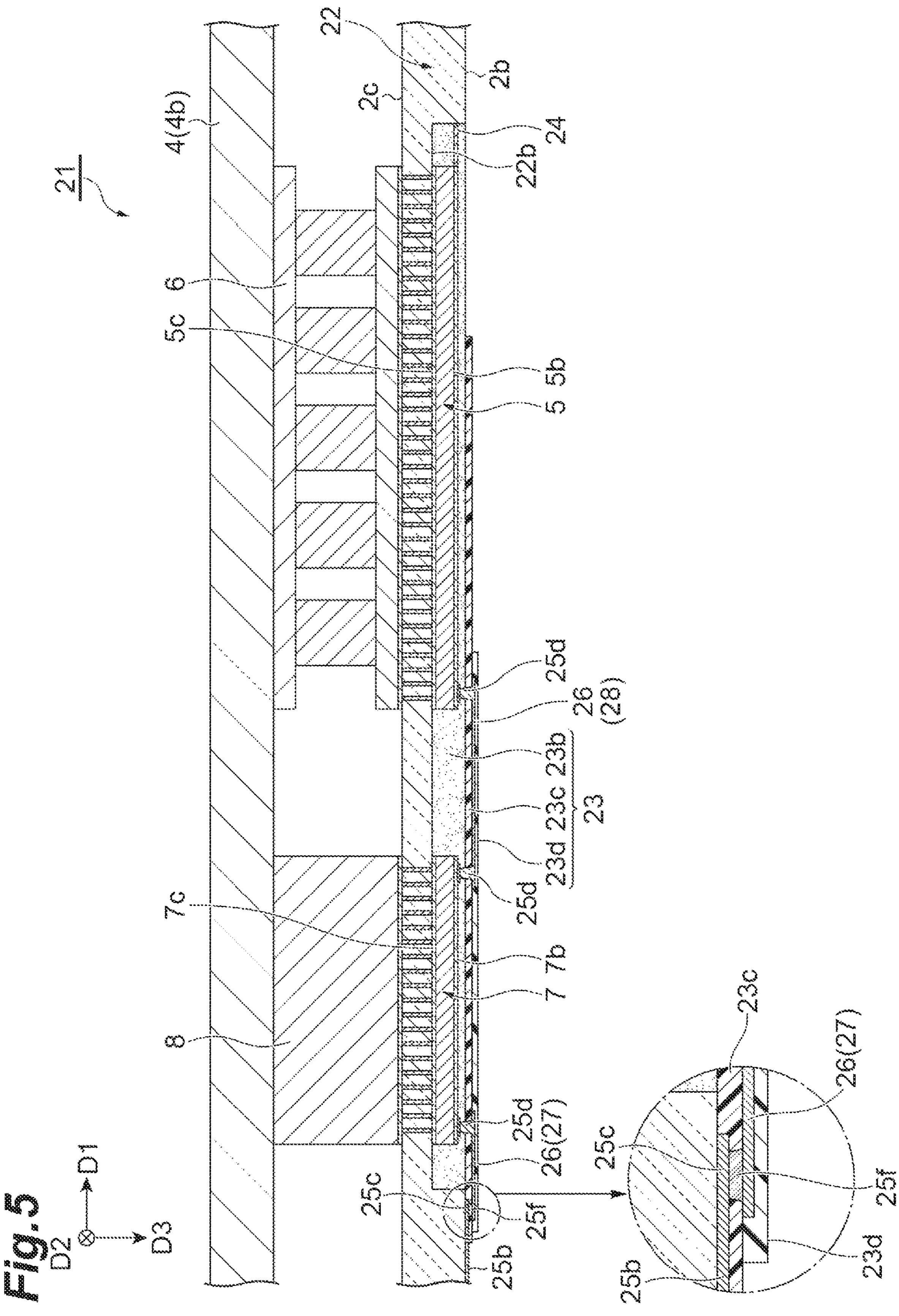
FIG. 5 is a cross-sectional view illustrating a resin layer of the optical module of FIG. 4.

FIG. 5 is an enlarged view of the structure around the resin layer 23 in FIG. 4. As illustrated in FIGS. 4 and 5, the optical module 21 has electrical wiring **25*b* formed on the first face 2*b* of the board 22. The electrical wiring 25*b* is configured with, for example, copper (Cu) or gold (Au). In the case where the electrical wiring 25*b* is configured with copper (Cu), the face of the electrical wiring 25*b* may be plated with gold (Au). An insulating layer may be formed between the electrical wiring 25*b* and the board 22. The electrical wiring 25*b* may be covered with the insulating film (protective film). For example, the electrical wiring 25*b* has a pad 25*c* at the position spaced apart from an end face 22*c* of the board 22. In the case where the electrical wiring 25*b* is covered with the insulating film (protective film) as described above, the insulating film is removed at a portion of the pad 25*c*, and the electrical wiring 25*b*** is exposed at that portion.

Each of the optical element 5 and the electrical element 7 has the circuit face facing opposite side from the board 22. On the circuit face of the electrical element 7, for example, the active elements such as transistors, electrical wiring, or pads are formed. For example, the passive elements such as electrodes are formed on the substrate face of the electrical element 7. In the case where the optical element 5 is the optical modulator, for example, the optical waveguide, the optical splitter, the optical coupler, the electrical wiring, or the pad is formed on the circuit face of the optical element 5. The epitaxial layer may be formed on the circuit face of the optical element 5, or the active element may be mounted on the circuit face. For example, the passive element such as the electrode or the lens may be mounted on the substrate face of the optical element 5.

The resin layer 23 is configured with resin filled in the recessed portion 22*b* of the board 22. The optical element 5 and the electrical element 7 are buried in the resin of the resin layer 23. For example, the resin is filled in the recessed portion 22*b* in the liquid state so as to bury the optical element 5 and the electrical element 7 arranged in the recessed portion 22*b*. The resin is then exposed to light and developed if necessary. Accordingly, the resin layer 23 is formed.

For example, the resin layer 23 includes a first resin layer 23*b* in contact with the bottom face of the recessed portion 22*b*, a second resin layer 23*c* located on the opposite side of the bottom face of the first resin layer 23*b*, and a third resin layer 23*d* located on the opposite side of the first resin layer 23*b* as viewed from the second resin layer 23*c*. The resin constituting the first resin layer 23*b* is, for example, a photosensitive polymer. The first resin layer 23*b* is formed to bury the recessed portion 22*b*. The first resin layer 23*b* buries the optical element 5 and the electrical element 7 in the recessed portion 22*b*. The thickness (length in the third direction D3) of the first resin layer 23*b* is substantially the same as, for example, the depth (length in the third direction D3) of the recessed portion 22*b*. In this case, the surface (face opposite side of the bottom face of the recessed portion 22*b*) of the first resin layer 23*b* is flush with the first face 2*b*. However, the thickness of the first resin layer 23*b* may be thicker or thinner than the depth of the recessed portion 22*b*.

The second resin layer 23*c* is a layer on which a plurality of electrical wirings 26 are formed. The electrical wiring 26 is, for example, a metal film formed on the resin layer 23. The electrical wiring 26 is configured with, for example, copper (Cu). The electrical wiring 26 is formed, for example, by a plating process such as a semi-additive method. In this case, the electrical wiring 26 is also referred to as a redistribution layer (RDL). The second resin layer 23*c* functions as a base for forming the electrical wiring 26. The second resin layer 23*c* covers the pad 25*c* of the electrical wiring 25*b*, the electrode of the electrical element 7, and the electrode of the optical element 5. The plurality of electrical wirings 26 include electrical wiring 27 electrically connecting the pad 25*c* of the electrical wiring 25*b* and the electrode of the electrical element 7 to each other, and electrical wiring 28 electrically connecting the electrode of the electrical element 7 and the electrode of the optical element 5 to each other. The electrical element 7 receives, for example, the electrical signal S input to the terminal 11 from the outside through the electrical wiring 27, and outputs the drive signal generated according to the electrical signal S to the optical element 5 through the electrical wiring 28. In the first direction D1, the electrical element 7 is arranged between the terminal 11 and the optical element 5. Alternatively, the electrical element 7 receives, for example, a received signal generated according to the optical signal L from the optical element 5 through the electrical wiring 28 and outputs the electrical signal S generated according to the received signal to the terminal 11 through the electrical wiring 27. In the first direction D1, the electrical element 7 is arranged between the terminal 11 and the optical element 5.

The resin constituting the second resin layer 23*c* is, for example, a photosensitive polymer. The resin is applied to the first resin layer 23*b* in the liquid state, or is stacked to the first resin layer 23*b* in the film state. Thereafter, the second resin layer 23*c* is formed by exposing and developing the resin. It is noted that the second resin layer 23*c* may be omitted. In this case, the first resin layer 23*b* may be integrated with the second resin layer 23*c* to cover the pad 25*c* of the electrical wiring 25*b*, the electrode of the electrical element 7, and the electrode of the optical element 5. Then, the electrical wiring 26 may be formed on the first resin layer 23*b*.

For example, the optical module 21 has a via 25*d* for accessing the electrode of the optical element 5 and the electrode of the electrical element 7 and a via 25*f* for accessing the electrical wiring 25*b*. Each of the via 25*d* and 25*f* is configured with, for example, a via hole formed by irradiation with the laser beam and the electrical wiring formed in the via hole. The electrical wiring of the via 25*d* may be formed separately from the electrical wiring 26, or may be formed together with (at one time) the electrical wiring 26. The via 25*d* may be a filled via of which inside is filled with a conductive material, or may be a conformal via of which inside is not filled with the conductive material. The same applies to the via 25*f*.

The electrical wiring 27 and the electrical wiring 28 are formed on the second resin layer 23*c* (face of the second resin layer 23*c* opposite to the first resin layer 23*b*). Both ends of the electrical wiring 28 in the first direction D1 are electrically connected to each of the optical element 5 and the electrical element 7 through the via 25*d*. Therefore, the optical element 5 and the electrical element 7 are electrically connected to each other through the electrical wiring 28 and the via 25*d*. For example, like the electrical wiring 10 described above, the electrical wiring 28 includes the signal wiring for transmitting high-speed signals (high-frequency signals). For example, the electrical wiring 28 constitutes the transmission line as the signal wiring. In the case where the optical element 5 is a modulation element, the characteristic impedance of the electrical wiring 28 may be substantially equal to the resistance value of the high frequency wiring (transmission line) and the termination resistance formed in the optical element 5 for impedance matching. "Substantially equal" indicates that the values may differ within the practically acceptable range. For example, the electrical wiring 27 includes the signal wiring for transmitting high-speed signals (high-frequency signals), similarly to the electrical wiring 2*h* described above. For example, the electrical wiring 27 constitutes the transmission line as the signal wiring. The characteristic impedance of the electrical wiring 27 may be substantially equal to the resistance value of the termination resistance formed in the electrical element 7 connected to the electrical wiring 27 for impedance matching. The characteristic impedance of the electrical wiring 27 may be different from the characteristic impedance of the electrical wiring 28.

The third resin layer 23*d* covers the electrical wiring 26 and protects the electrical wiring 26. Therefore, the electrical wiring 26 is formed between the second resin layer 23*c* and the third resin layer 23*d*. The resin constituting the third resin layer 23*d* is, for example, a photosensitive polymer. The resin may be applied to the second resin layer 23*c* in the liquid state, or may be stacked to the second resin layer 23*c* in the film state. Thereafter, the third resin layer 23*d* is formed by exposing and developing the resin. It is noted that the third resin layer 23*d* may be omitted.

The resin waveguide 24 is buried in the first resin layer 23*b*. The first resin layer 23*b* functions as a clad in the optical waveguide for the optical signal L inputting to and outputting from the optical element 5 and confines the optical signal L inside the resin waveguide 24, which functions as a core layer. The refractive index of the resin waveguide 24 and the first resin layer 23*b* is, for example, in the range of 1.3 to 1.7 in the wavelength band of the optical signal. The first resin layer 23*b* has a refractive index smaller than that of the resin waveguide 24. For example, a linear expansion coefficient of the resin constituting the first resin layer 23*b* is smaller than a linear expansion coefficient of the resin constituting the resin waveguide 24. In this case, the effects (for example, a decrease in optical coupling efficiency) of thermal expansion or contraction of the first resin layer 23*b* on the optical coupling between the optical element 5 and the board 22 by the resin waveguide 24 can be reduced.

The second resin layer 23*c* is spaced apart from the resin waveguide 24. That is, the position of the second resin layer 23*c* in the first direction D1 is different from the position of the resin waveguide 24 in the first direction D1. In this case, the effects of thermal expansion or contraction of the second resin layer 23*c* on the optical coupling between the optical element 5 and the board 22 by the resin waveguide 24 can be reduced. The optical coupling between the resin waveguide 24 and the optical element 5 may be performed with the end faces of each optical waveguide facing each other, or may be performed by evanescent coupling in which the optical waveguides are overlapped with each other by a predetermined distance in the traveling direction of the optical signal L.

Figure 6:
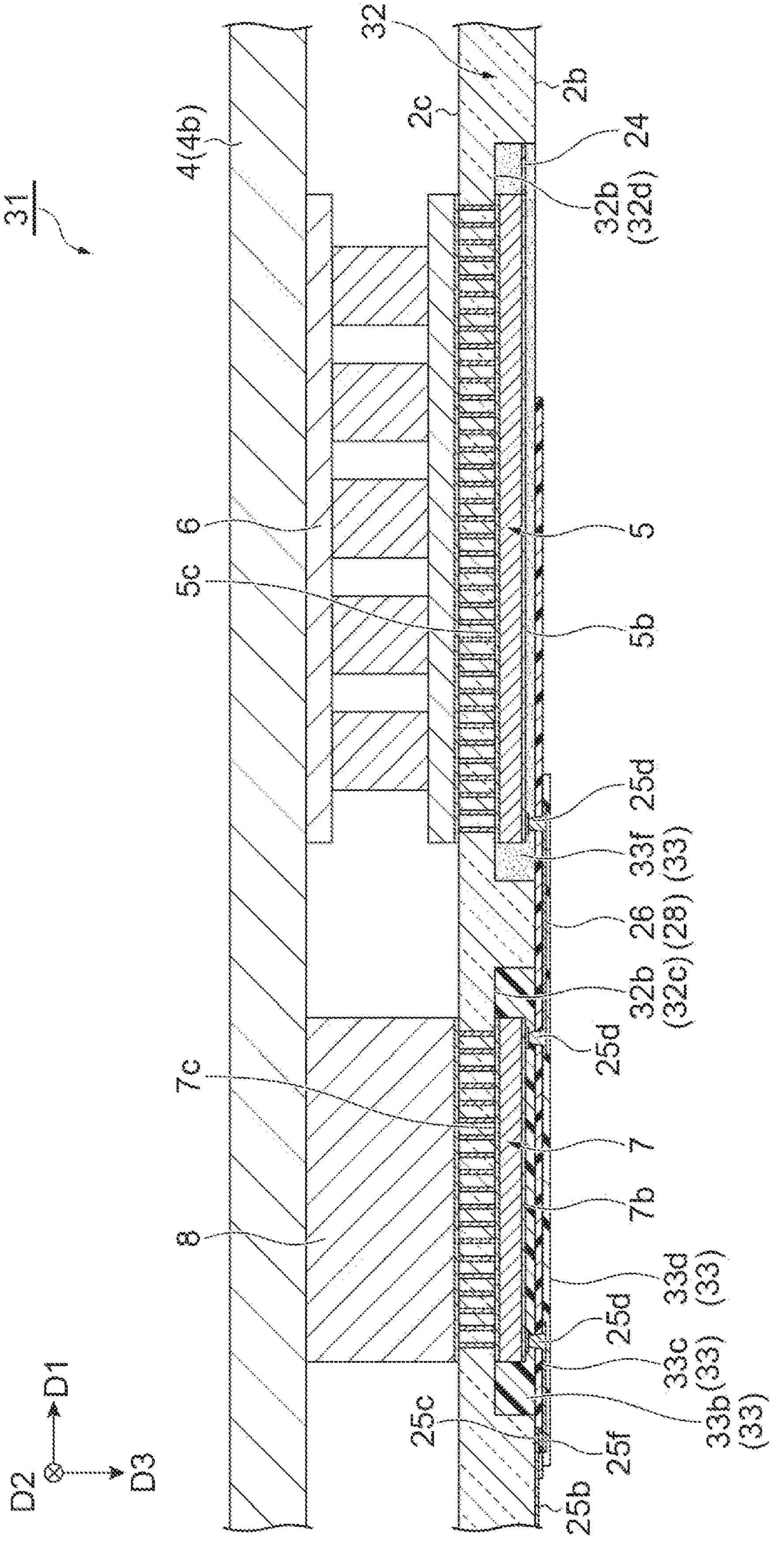
FIG. 6 is a cross-sectional view illustrating an optical module according to Modified Example 2.

FIG. 6 is a cross-sectional view illustrating an optical module 31 according to Modified Example 2. The optical module 31 includes a board 32 in which a recessed portion 32*b* is formed on the first face 2*b*. The board 32 is different from the board 22 in that the recessed portion 32*b* includes a first recessed portion 32*c* and a second recessed portion 32*d*. The recessed portion 32*b* includes the first recessed portion 32*c* and the second recessed portion 32*d* that are independent of each other. The first recessed portion 32*c* is located between the terminal 11 and the second recessed portion 32*d* in the first direction D1. The electrical element 7 is mounted within the first recessed portion 32*c*, and the optical element 5 is mounted within the second recessed portion 32*d*.

The optical module 31 has a resin layer 33 configured with resin filling the recessed portion 32*b*. The resin layer 33 includes a first resin layer 33*b*, a second resin layer 33*c*, and a third resin layer 33*d* formed in the first recessed portion 32*c*, and a fourth resin layer 33*f* formed in the second recessed portion 32*d*. For example, each of the second resin layer 33*c* and the third resin layer 33*d* is the same as each of the second resin layer 23*c* and the third resin layer 23*d* described above.

The first resin layer 33*b* is formed to bury the first recessed portion 32*c*. Since the first resin layer 23*b* described above functions as a clad in the resin waveguide 24, the optical module 1 has transparency in the wavelength band used by the optical module 1 (wavelength band of the optical signal L) and has the refractive index smaller than the refractive index of the resin waveguide 24. On the other hand, since the first resin layer 33*b* is separated from the resin waveguide 24, the first resin layer 33*b* may not have the refractive index smaller than the refractive index of the resin waveguide 24 and may not have transparency. For example, the transmittance of the first resin layer 33*b* may be less than 80% at the wavelength of the optical signal L. For example, as different from the material of the first resin layer 23*b*, the material of the first resin layer 33*b* has no restrictions such as refractive index. On the other hand, like the first resin layer 23*b*, the material of the fourth resin layer 33*f* has restrictions such as refractive index. The fourth resin layer 33*f* functions as a clad in the optical waveguide for the optical signal L inputting and outputting from and to the optical element 5. Therefore, the material of the fourth resin layer 33*f* may be the same as the material of the first resin layer 23*b* described above.

As described above, in the optical module 31, the first recessed portion 32*c* in which the electrical element 7 is accommodated and the second recessed portion 32*d* in which the optical element 5 is accommodated are formed separately from each other. Therefore, the volume of the resin layer 33 can be reduced. Since the volume of the fourth resin layer 33*f* formed in the second recessed portion 32*d* in which the optical element 5 is accommodated can be reduced, the effects of thermal expansion or contraction on the optical coupling between the optical element 5 and the board 32 by the resin waveguide 24 can be further reduced. Further, the amount of resin buried between the optical element 5 and the electrical element 7 can be reduced. Accordingly, the occurrence of the stress caused by temperature changes and the amount of deformation caused by the stress can be reduced, and thus, the reliability of the electrical wiring 28 can be improved.

Figure 7:
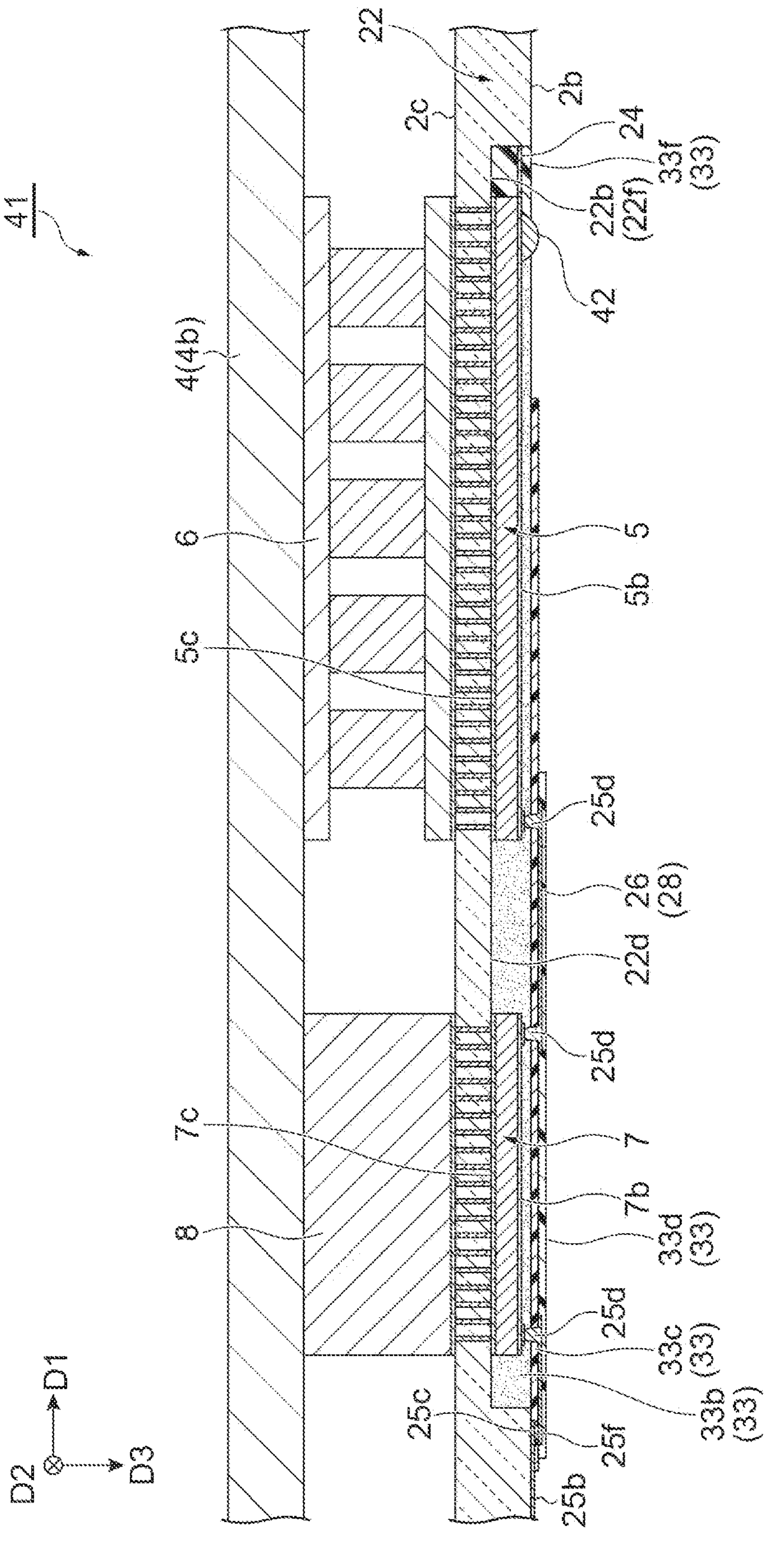
FIG. 7 is a cross-sectional view illustrating an optical module according to Modified Example 3.

FIG. 7 is a cross-sectional view illustrating an optical module 41 according to Modified Example 3. The optical module 41 includes the board 22 in which the recessed portion 22*b* is formed on the first face 2*b* and a separation portion 42 separating the resin layer 33 formed in the recessed portion 22*b*. For example, the separation portion 42 is a resin stopper configured with resin. The material of the separation portion 42 is, for example, epoxy resin. For example, the separation portion 42 is formed on the side of the optical element 5 opposite side of the board 2. The separation portion 42 separates the area where the resin waveguide 24 is arranged from the area where the electrical element 7 of the recessed portion 22*b* is arranged.

Figure 8:
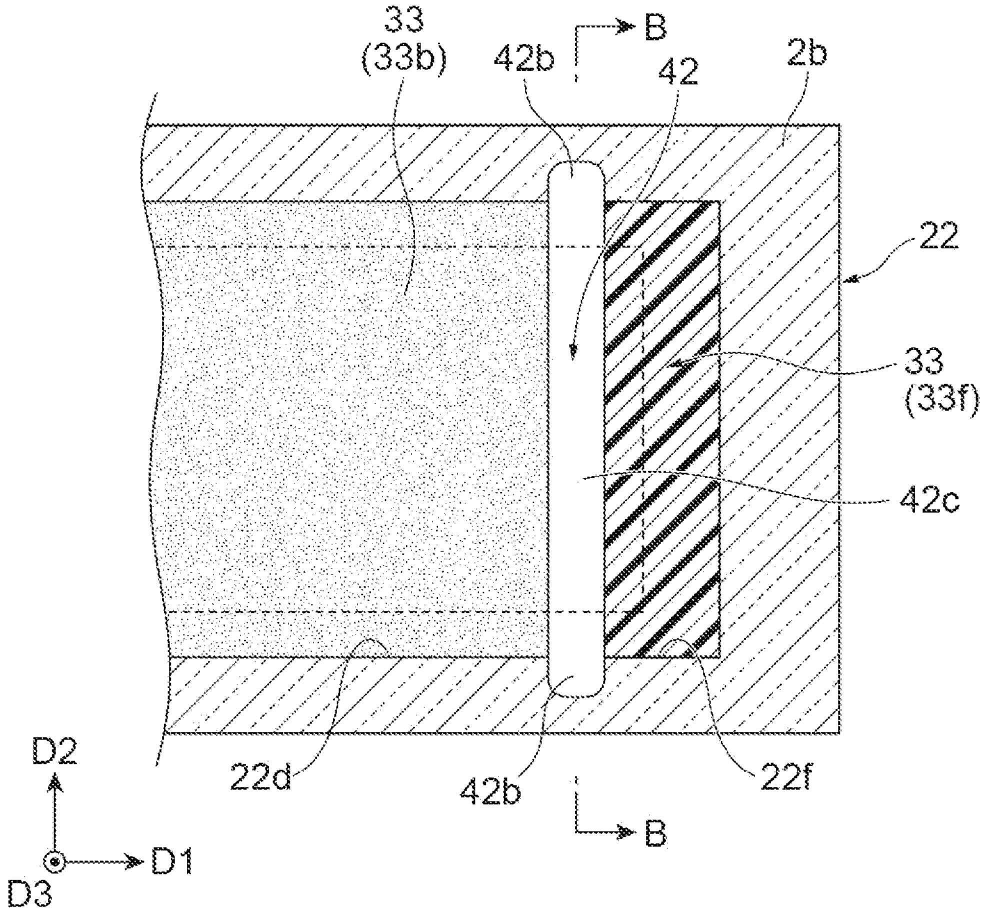
FIG. 8 is a diagram illustrating a separation portion of the optical module of FIG. 7.
Figure 9:
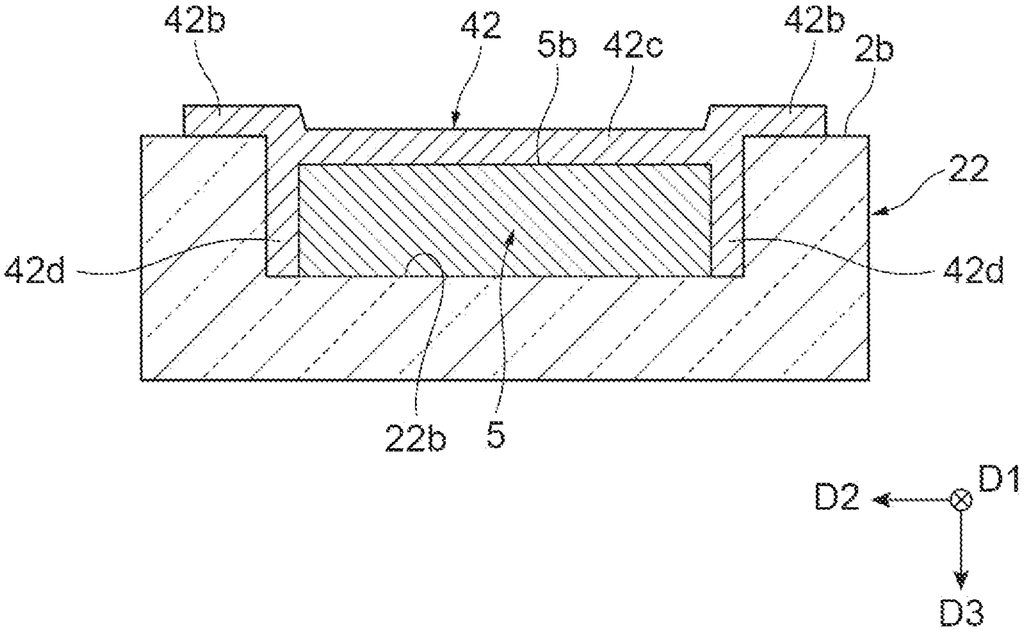
FIG. 9 is a cross-sectional view taken along line B-B in FIG. 8.

FIG. 8 is a diagram of the separation portion 42 viewed along the third direction D3 (in the plan view of the board 2). FIG. 9 is a cross-sectional view taken along the line B-B in FIG. 8. As illustrated in FIGS. 7, 8, and 9, the separation portion 42 has a pair of first portions 42*b* in contact with the first face 2*b* of the board 22 and aligned along the second direction D2, the second portion 42*c* in contact with the first face 5*b* of the optical element 5 and connecting the pair of first portions 42*b* to each other, and a pair of third portions 42*d* located on both sides of the optical element 5 in the second direction D2. The recessed portion 22*b* is separated by the separation portion 42 into a first area 22*d* where the electrical element 7 is arranged and a second area 22*f* where the resin waveguide 24 is arranged. The first resin layer 33*b*, the second resin layer 33*c*, and the third resin layer 33*d* are formed in the first area 22*d*, and the fourth resin layer 33*f* is formed in the second area 22*f*. The separation portion 42 is formed, for example, by applying resin to the optical element 5 arranged in the recessed portion 22*b* and heating and curing the resin. The separation portion 42 allows the formation of the first resin layer 33*b*, the second resin layer 33*c*, and the third resin layer 33*d*, and the formation of the fourth resin layer 33*f* to be performed independently of each other.

As described above, in the optical module 41, the board 22 has one recessed portion 22*b*, and the recessed portion 22*b* is separated by the separation portion 42. The separation portion 42 is formed on the optical element 5, and the fourth resin layer 33*f* is formed in the second area 22*f* of the separation portion 42 located on the opposite side of the electrical element 7. Therefore, since the volume of the fourth resin layer 33*f* can be further reduced, the effects of thermal expansion or contraction on the optical coupling between the optical element 5 and the board 22 by the resin waveguide 24 can be reduced more reliably. Furthermore, since the separation portion 42 is fixed to the optical element 5, the affects effects of the stress on the resin waveguide 24 from the first resin layer 33*b* can be reduced.

Figure 10:
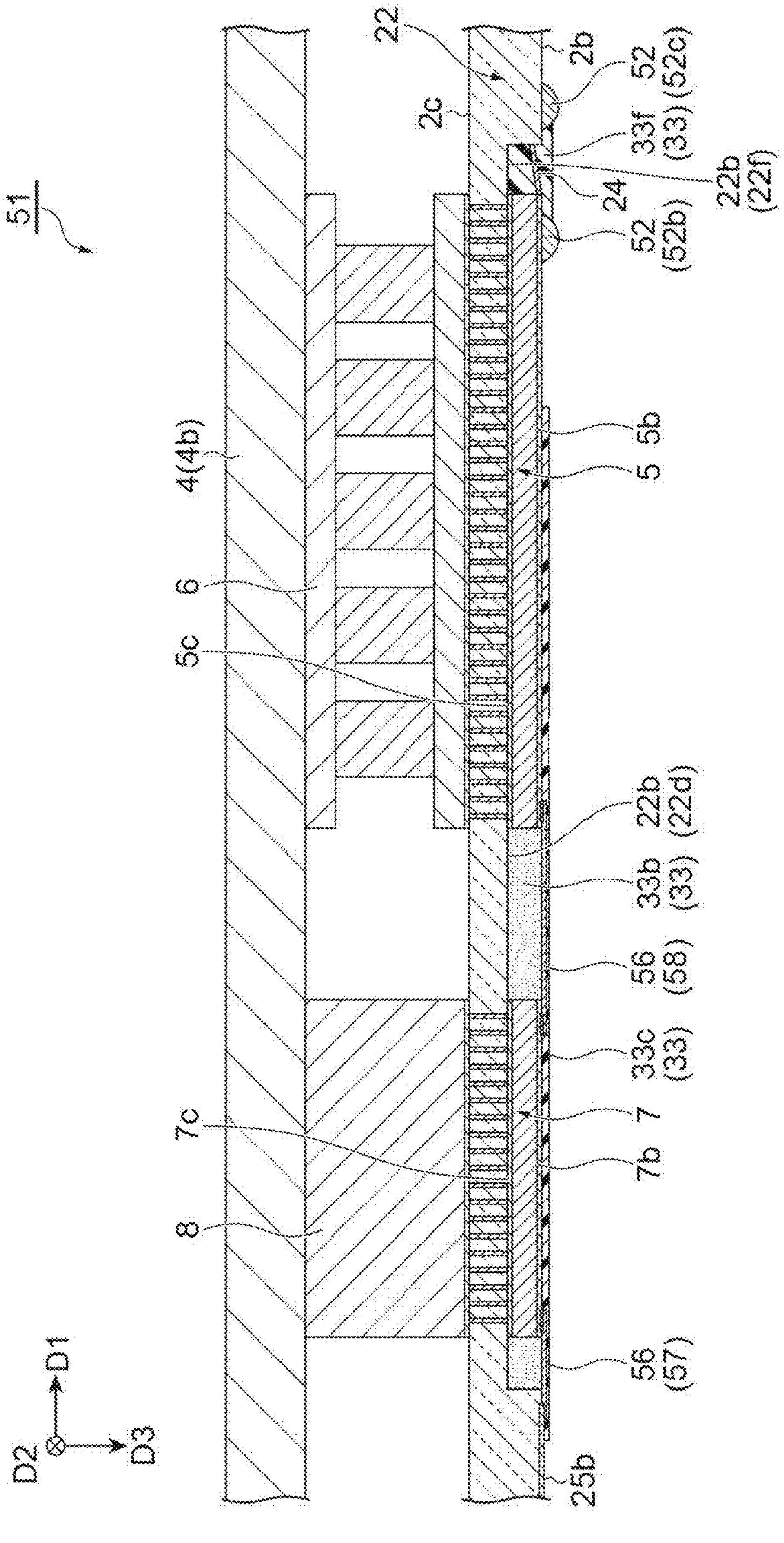
FIG. 10 is a cross-sectional view illustrating an optical module according to Modified Example 4.

FIG. 10 is a cross-sectional view illustrating an optical module 51 according to Modified Example 4. The optical module 51 includes a separation portion 52 having a different form from the separation portion 42 and a plurality of electrical wirings 56 formed in the resin layer 33. The electrical wiring 56 is configured with, for example, silver (Ag). The electrical wiring 56 is formed by an inkjet method. More specifically, the electrical wiring 56 is formed by sintering the layer of nanosilver particles applied to the board 2 and the resin layer 33 (first resin layer 33*b*).

The electrical wiring 56 is protected by the second resin layer 33*c*. However, this second resin layer 33*c* can also be omitted. The electrical wiring 56 may include the transmission line with the characteristic impedance set as the signal wiring. The plurality of electrical wirings 56 include the electrical wiring 57 electrically connecting the electrical wiring 25*b* formed on the first face 2*b* and the electrode of the electrical element 7 to each other, and the electrical wiring 58 electrically connecting the electrode of the electrical element 7 and the electrode of the optical element 5 to each other. The electrical wiring 25*b*, the electrical wiring 57, and the electrical wiring 58 can be formed without any step in the third direction D3.

Figure 11:
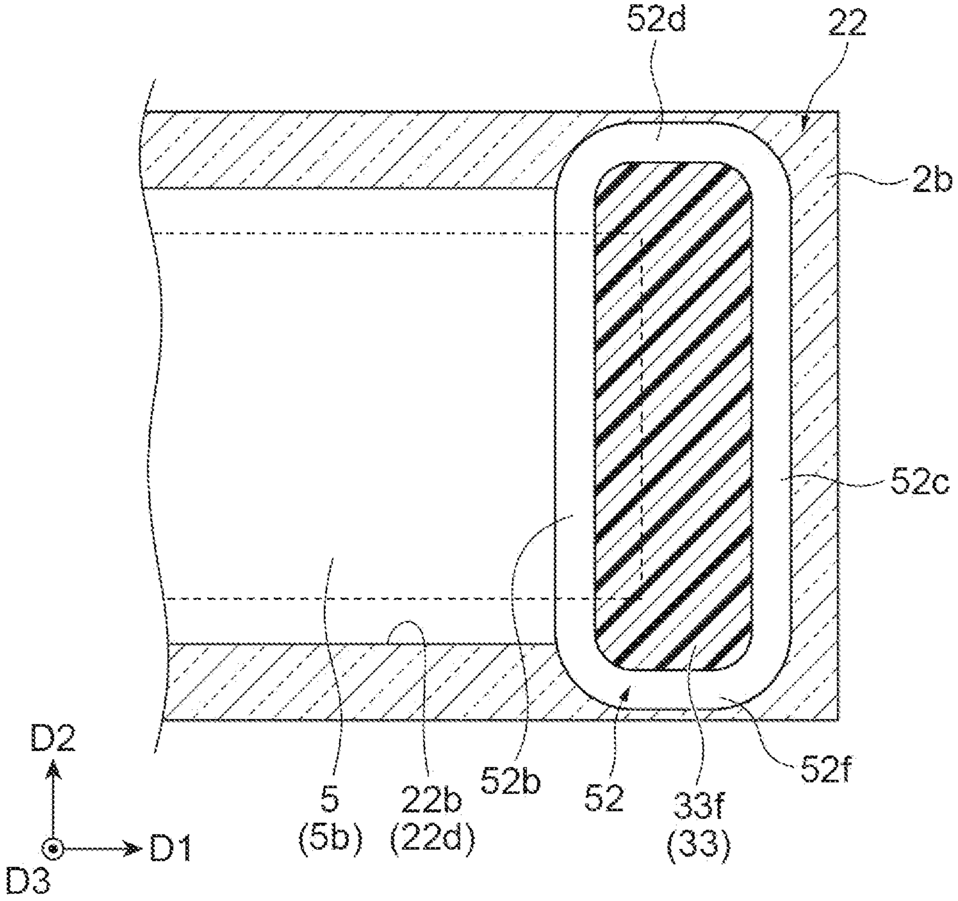
FIG. 11 is a diagram illustrating a separation portion of the optical module of FIG. 10.

FIG. 11 is a diagram of the separation portion 52 viewed along the third direction D3. As illustrated in FIGS. 10 and 11, the separation portion 52 has a rectangular frame shape as viewed along the third direction D3. The separation portion 52 may be formed as a closed curve having a predetermined line width. The separation portion 52 includes a first extension portion 52*b* straddling the recessed portion 22*b* and extending along the second direction D2, a second extension portion 52*c* extending along the second direction D2 on the first face 2*b*, and a third extension portion 52*d* and a fourth extension portion 52*f* extending from the end of the first extension portion 52*b* in the second direction D2 to the end of the second extension portion 52*c* in the second direction D2.

The recessed portion 22*b* is separated by the first extension portion 52*b* into the first area 22*d* where the electrical element 7 is arranged and the second area 22*f* where the resin waveguide 24 is arranged. The first resin layer 33*b* and the second resin layer 33*c* are formed in the first area 22*d*, and the fourth resin layer 33*f* is formed in the second area 22*f*. The fourth resin layer 33*f* is formed in an inner area surrounded by the separation portion 52 as viewed along the third direction D3. The second extension portion 52*c*, the third extension portion 52*d*, and the fourth extension portion 52*f* are formed on the first face 2*b* of the board 22, and function as a leakage stopper of the resin of the fourth resin layer 33*f* from the second area 22*f*. The line width and length of the separation portion 52 as viewed along the third direction D3 are determined in consideration of the adhesion of the separation portion 52 to the board 22 and the optical element 5.

Figure 12:
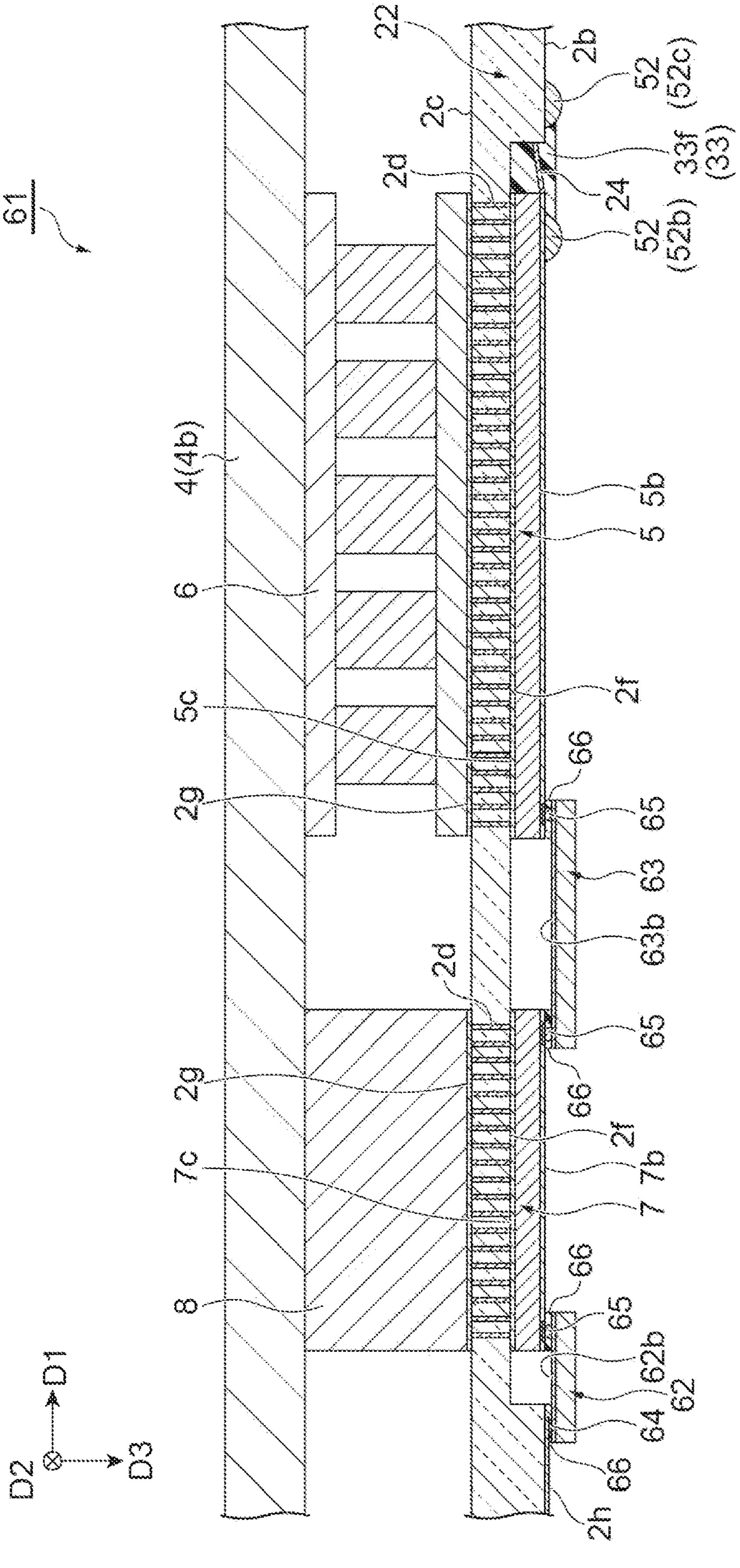
FIG. 12 is a cross-sectional view illustrating an optical module according to Modified Example 5.

FIG. 12 is a cross-sectional view illustrating an optical module 61 according to Modified Example 5. The optical module 61 includes a wiring chip 62 electrically connecting the outside of the optical module 61 and the electrical element 7 to each other, and a wiring chip 63 electrically connecting the optical element 5 and the electrical element 7 to each other. The wiring chip 62 includes a substrate having insulating properties and electrical wiring 62*b* formed on the substrate and facing the first face 2*b* of the board 22. The substrate is configured with, for example, glass or silicon. The electrical wiring 62*b* is configured with a conductive material.

The face of the wiring chip 62 on which the electrical wiring 62*b* is formed is a circuit face of the wiring chip 62, and the face opposite to the circuit face is a substrate face. The wiring chip 62 is flip-chip-mounted on the electrical wiring 2*h* formed on the first face 2*b* through a bump 64 and is flip-chip-mounted on the electrode of the electrical element 7 through a bump 65. That is, the circuit face of the wiring chip 62 is connected to the first face 2*b* of the board 2 and the circuit face of the electrical element 7. The electrical wiring 2*h* is electrically connected to the electrical element 7 through the electrical wiring 62*b* formed on the wiring chip 62.

The wiring chip 63 has electrical wiring 63*b* facing the first face 5*b* of the optical element 5 and the first face 7*b* of the electrical element 7. The electrical wiring 63*b* is configured with a conductive material. The wiring chip 63 is flip-chip-mounted on each of the electrodes of the optical element 5 and the electrodes of the electrical element 7 through the bump 65. That is, the circuit face of the wiring chip 63 is connected to each of the circuit face of the optical element 5 and the circuit face of the electrical element 7. The electrical element 7 is electrically connected to the optical element 5 through the electrical wiring 63*b*.

Each of the electrical wiring 62*b* and the electrical wiring 63*b* is configured with, for example, copper (Cu). As an example, the copper (Cu) of the electrical wiring 62*b* and the electrical wiring 63*b* may be formed by a plating process. The insulating layer may be formed on the surfaces of the wiring chip 62 and the wiring chip 63. In this case, the insulation of the optical element 5 and the electrical element 7 from the respective circuit layers and the surface protection are enabled. The insulating layer is configured with, for example, a polymer. The insulating layer may be formed between the electrical wiring 62*b* and the substrate layer of the wiring chip 62. The insulating layer is, for example, an $SiO_2$ film. In this case, the insulation of the substrate layer of the wiring chip 62 and the electrical wiring 62*b* is enabled. Similarly, the insulating layer may be formed between the electrical wiring 63*b* and the substrate layer of the wiring chip 63.

Each of the electrical wiring 62*b* and the electrical wiring 63*b* may include the transmission line with the characteristic impedance set as the signal wiring. The bump 65 may be, for example, a solder bump, an Au stud bump, or a micro-bump with a solder cap placed on a Cu pillar. In this case, the area required for the electrical wiring can be reduced by allowing the pad to be small, and the intervals between the wirings can be reduced to form the plurality of electrical wirings 62*b* and the plurality of electrical wirings 63*b* with high density.

Each of the wiring chip 62 and the wiring chip 63 is firmly connected to each of the electrodes of the optical element 5 and the electrical element 7 by, for example, an ultrasonic method or a thermocompression bonding method. For example, each of the bumps 64 and 65 is covered with an underfill resin 66. Accordingly, the bumps 64 and 65 are protected, and a bonding strength with the wiring chips 62 and 63 is reinforced. The underfill resin 66 may be omitted. In the case where the speed of the electrical signal transmitted by the electrical wiring 62*b* is relatively slow, the bonding wire may be arranged instead of the wiring chip 62. The same applies to the electrical wiring 63*b*.

Figure 13:
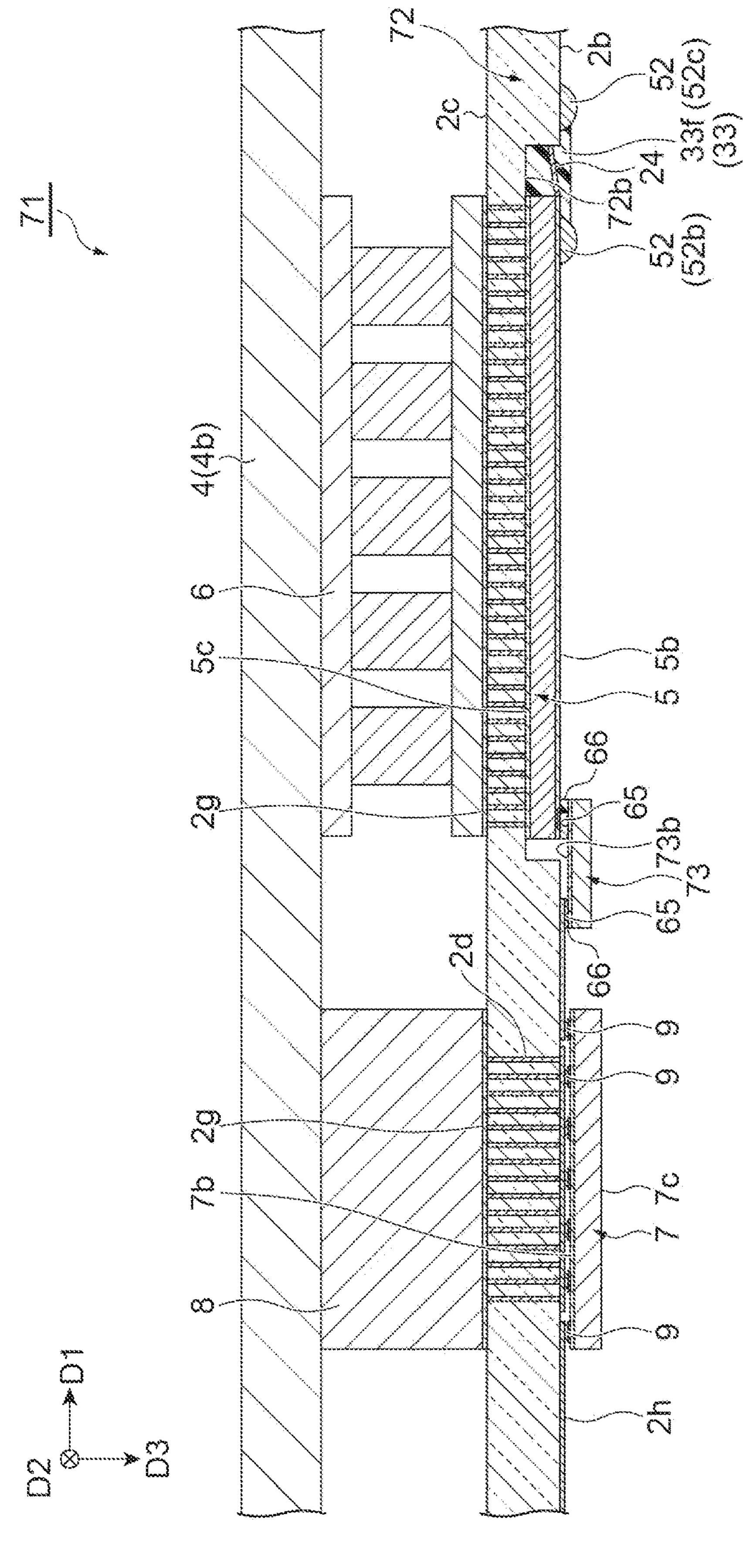
FIG. 13 is a cross-sectional view illustrating an optical module according to Modified Example 6.

FIG. 13 is a cross-sectional view illustrating an optical module 71 according to Modified Example 6. The optical module 71 includes a board 72 having a recessed portion 72*b* that is different from the recessed portion 22*b*. The first face 2*b* of the board 72 has the recessed portion 72*b*, the optical element 5 is mounted within the recessed portion 72*b*, and the electrical element 7 is mounted outside the recessed portion 72*b*. The electrical element 7 is mounted so that the circuit layer faces the board 72 (flip-chip-mounting). The optical element 5 is mounted face-up in the recessed portion 72*b*.

The optical module 71 has a wiring chip 73 electrically connecting the optical element 5 and the electrical element 7 to each other. The wiring chip 73, like the wiring chip 63 and the like described above, has electrical wiring 73*b* formed on the board. The plurality of bumps 9 are formed on the electrode of the electrical element 7. Any one of the plurality of bumps 9 is connected to the electrical wiring 2*h*. Further, any one of the plurality of bumps 9 is connected to the electrode of the optical element 5 through the wiring chip 73. The electrode of the optical element 5 is electrically connected to the electrode of the electrical element 7 through the bump 65, and the electrical wiring 73*b* formed on the wiring chip 73. It is noted that, instead of the wiring chip 73, the optical module 71 may have the relatively short bonding wire (for example, 100 μm or less) to reduce the effects of parasitic inductance.

Figure 14:
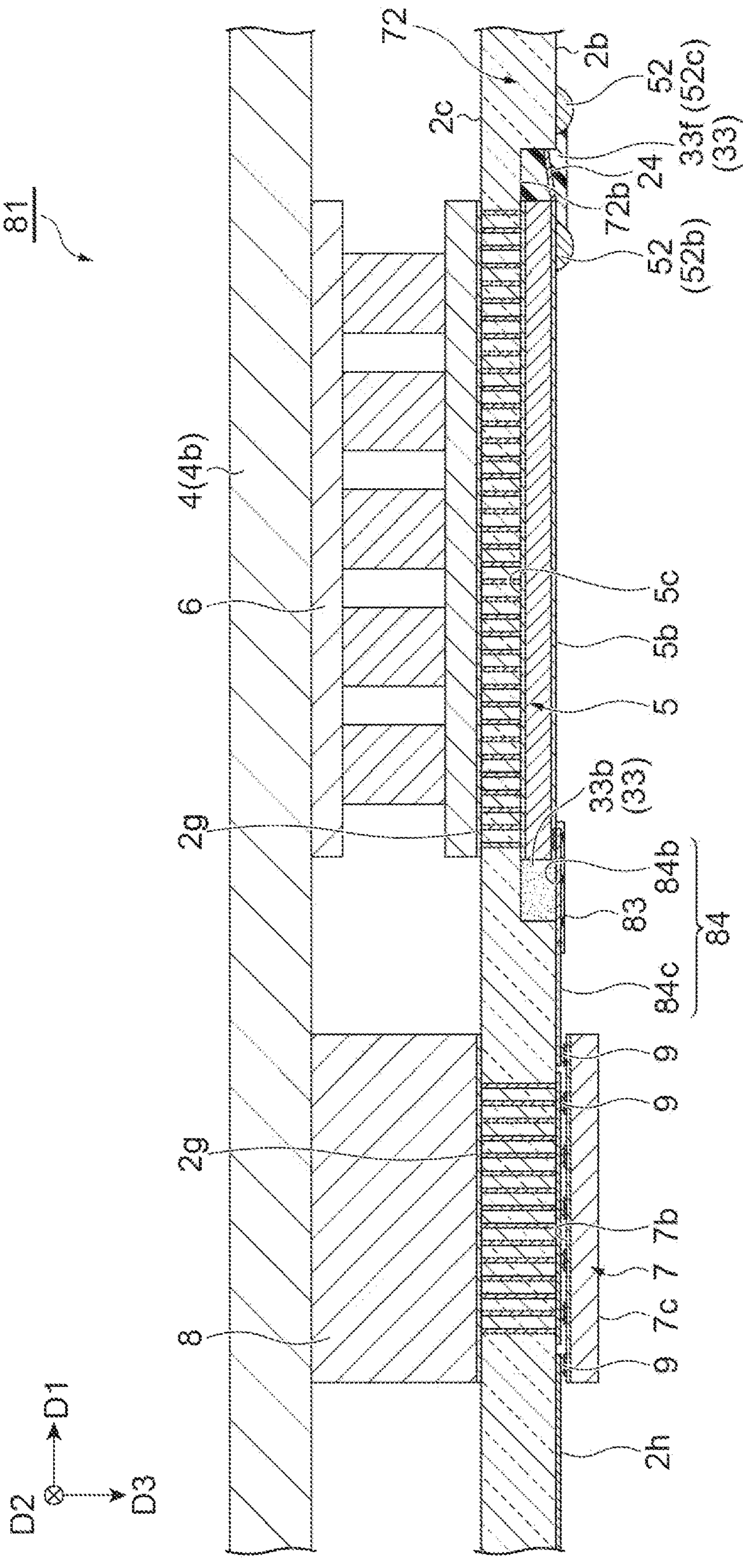
FIG. 14 is a cross-sectional view illustrating an optical module according to Modified Example 7.

FIG. 14 is a cross-sectional view illustrating an optical module 81 according to Modified Example 7. In the optical module 81, the first face 2*b* of the board 72 has the recessed portion 72*b*, and the optical module 81 includes the resin layer 33 (the first resin layer 33*b* and fourth resin layer 33*f*) filled in the recessed portion 72*b*. The optical module 81 includes electrical wiring 84 electrically connecting the optical element 5 and the electrical element 7 to each other and a resin layer 83 covering the electrical wiring 84. The electrical wiring 84 includes a first portion 84*c* formed on the first face 2*b* of the board 72 and a second portion 84*b* formed from the end of the first portion 84*c* over the resin layer 33 (the first resin layer 33*b*) to the electrode of the optical element 5. The first portion 84*c* (first wiring) is, for example, copper (Cu) or gold (Au) wiring. The first portion 84*c* (first wiring) may be formed similarly to, for example, the thermal pad on the first face 2*b* of the board 72. The second portion 84*b* (second wiring) is, for example, inkjet wiring or plated wiring (RDL). The first wiring and the second wiring are connected to each other in series. The second wiring may be formed to overlap with the first wiring at the connection location. The electrical wiring 84 may be the electrical wiring in which the first portion 84*c* and the second portion 84*b* are formed simultaneously (at one time).

Figure 15:
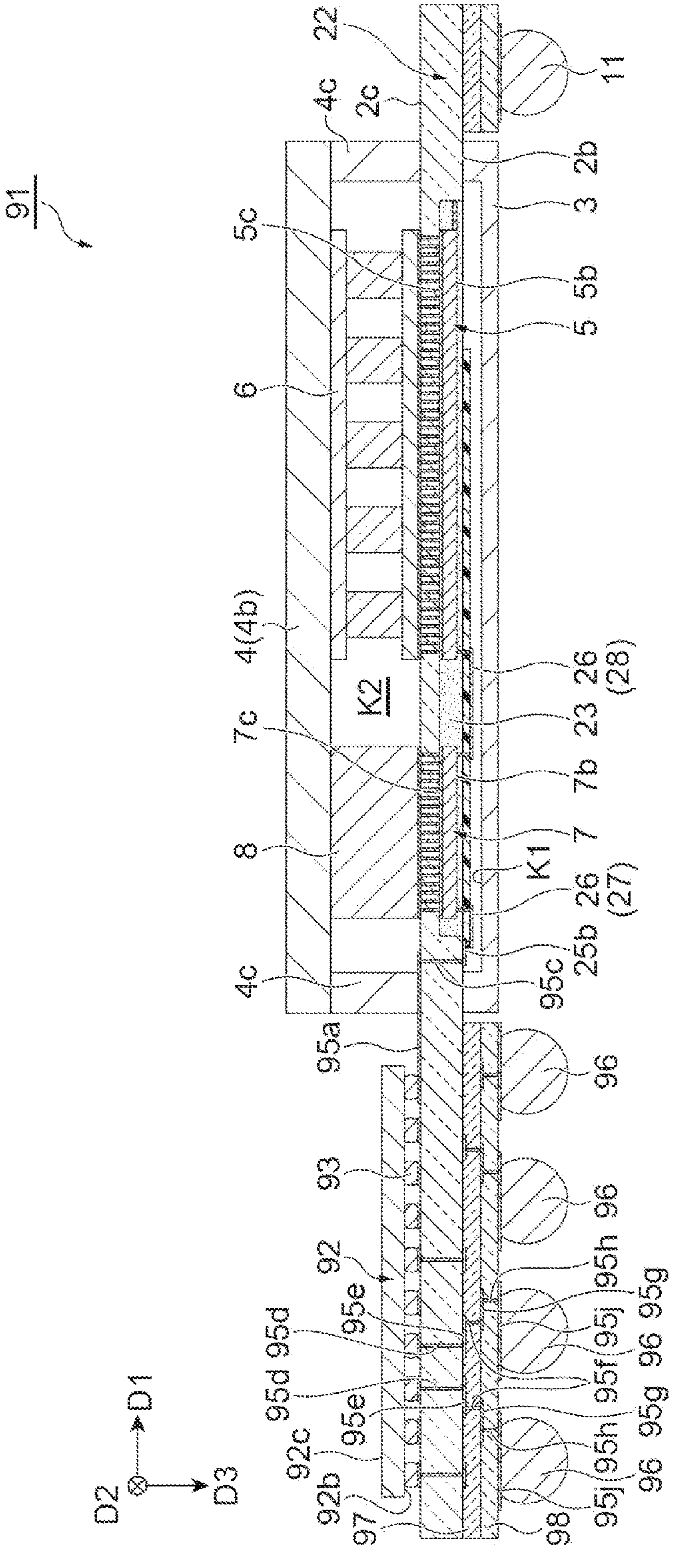
FIG. 15 is a cross-sectional view illustrating an optical module according to Modified Example 8.

FIG. 15 is a cross-sectional view illustrating an optical module 91 according to Modified Example 8. The optical module 91 includes a second electrical element 92 in addition to the optical element 5 and the electrical element 7. The second electrical element 92 is, for example, flip-chip-mounted on the second face 2*c* of the board 22. The second electrical element 92 is, for example, a DSP (digital signal processor). In this case, the second electrical element 92 has, for example, an SERDES function for mutually converting a parallel signal and a serial signal, an error correction function, an equalizer function, and an analog-to-digital conversion function.

The second electrical element 92 has a first face 92*b* facing the board 22, and a second face 92*c* facing opposite to the first face 92*b*. The optical module 91 has an electrode 93 electrically connecting the second electrical element 92 to the board 22. For example, the electrode 93 is the afore-mentioned micro-bump. The second electrical element 92 transmits and receives the parallel signals (for example, 100 channels of 8 GBd modulated signals) to and from the outside of the board 22 through the electrodes 93.

The optical module 91 includes a terminal 96 for external connection, a first board portion 98 to which the terminal 96 is fixed, and a second board portion 97 interposed between the first board portion 98 and the board 22. The optical module 91 constitutes a multilayer board having the first board portion 98 and the second board portion 97. For example, each of the first board portion 98 and the second board portion 97 is configured with the insulating layer having the via extending in the third direction D3, and the electrical wiring can be formed between the first board portion 98 and the second board portion 97. It is noted that the number of board portions of the optical module 91 can be changed as appropriate. That is, the optical module 91 may not include any one of the first board portion 98 and the second board portion 97, or may include another board portion in addition to the first board portion 98 and the second board portion 97.

The first board portion 98 and the second board portion 97 are, for example, glass boards. The optical module 91 includes a plurality of electrical wirings 95*d* penetrating the board 22 along the third direction D3, electrical wiring 95*e* extending along the first direction D1 at the end of the electrical wiring 95*d* opposite side of the second electrical element 92, a plurality of electrical wirings 95*f* penetrating the second board portion 97 along the third direction D3, and electrical wiring 95*g* extending along the first direction D1 at the end of the electrical wiring 95*f* opposite side of the board 22. The electrical wiring 95*g* is formed between the first board portion 98 and the second board portion 97. Further, the optical module 91 includes electrical wiring 95*h* penetrating the first board portion 98 from the electrical wiring 95*g* in the third direction D3, and electrical wiring 95*j* extending in the first direction D1 at the end of the electrical wiring 95*h* opposite side of the second board portion 97.

In the case where the first board portion 98 and the second board portion 97 are glass boards, high-density wiring is enabled as described above. The second electrical element 92 is electrically connected to the terminal 96 through the electrode 93, the electrical wiring 95*d*, the electrical wiring 95*f*, the electrical wiring 95*g*, the electrical wiring 95*h*, and the electrical wiring 95*j*. The terminal 96 is a spherical solder ball. The second electrical element 92 is electrically connected to the electrical element 7 through the electrical wiring 95*a* extending along the second face 2*c* from the electrode 93 to the inside (second airtight space K2) of the second housing 4, electrical wiring 95*c* penetrating the board 22 from the electrical wiring 95*a*, and the electrical wiring 25*b* extending from the electrical wiring 95*c* to the electrical wiring 26. The electrical wiring 25*b* is formed in the first airtight space K1. Each of the electrical wiring 95*a* and the electrical wiring 25*b* is configured with, for example, Cu (copper) or Au (gold). The electrical wiring 95*c* is configured with, for example, TGV. The electrical wiring 95*a*, the electrical wiring 95*c*, and the electrical wiring 25*b* may have uniform characteristic impedance. Specifically, The uniform characteristic impedance may be substantially equal to the termination resistance of the electrical element 7 connected to the electrical wiring 95*c* for impedance matching and the termination resistance of the second electrical element 92 connected to the electrical wiring 95*a* for impedance matching.

The second electrical element 92 transmits and receives the serial signal (as an example, the 200 GBd modulated signal of 4 channels) to and from the electrical element 7 through electrical wiring 95*a*, the electrical wiring 95*c*, and the electrical wiring 25*b*. For example, the second electrical element 92 converts the parallel signal received from the outside of the board 22 into the serial signal and transmits the serial signal to the electrical element 7. Further, the second electrical element 92 converts the serial signal received from the electrical element 7 into the parallel signal and transmits the parallel signal to the outside of the board 22. By allowing the second electrical element 92 to transmit and receive signals to and from the outside of the optical module 91 using parallel signals that are slower than serial signals, the speed of signals transmitted through the electrical wiring between the second electrical element 92 and the terminals 96 can be suppressed to be low. As a result, since the effects of impedance mismatching caused by the terminals 96, which are solder balls, and the like can be reduced, the performance of the optical module 91 is easily improved. Accordingly, BGA solder balls can be used instead of micro-bump for the terminals 96.

Figure 16:
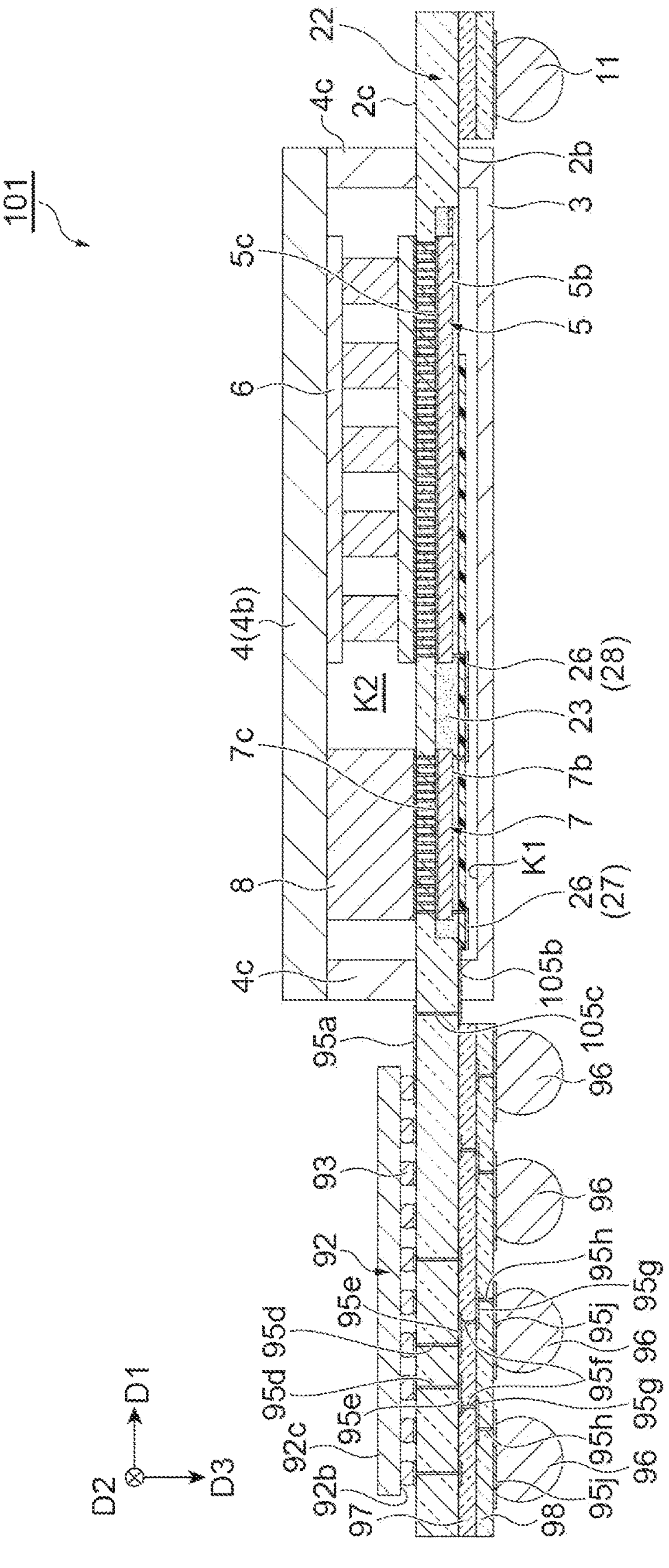
FIG. 16 is a cross-sectional view illustrating an optical module according to Modified Example 9.

FIG. 16 is a cross-sectional view illustrating an optical module 101 according to Modified Example 9. The optical module 101 is different from the optical module 91 in the form of wiring extending from the inside (first airtight space K1) of the first housing 3 to the second electrical element 92. The optical module 101 includes electrical wiring 105*c* penetrating the board 22 from the electrical wiring 95*a* in the third direction D3 outside the second housing 4, and electrical wiring 105*b* extending from the end of the electrical wiring 105*c* opposite side of the electrical wiring 95*a* to the first airtight space K1. The electrical wiring 95*a* and the electrical wiring 105*c* are formed outside the first housing 3 and the second housing 4, and the electrical wiring 105*b* extends from the first airtight space K1 to the outside of the first airtight space K1.

Figure 17:
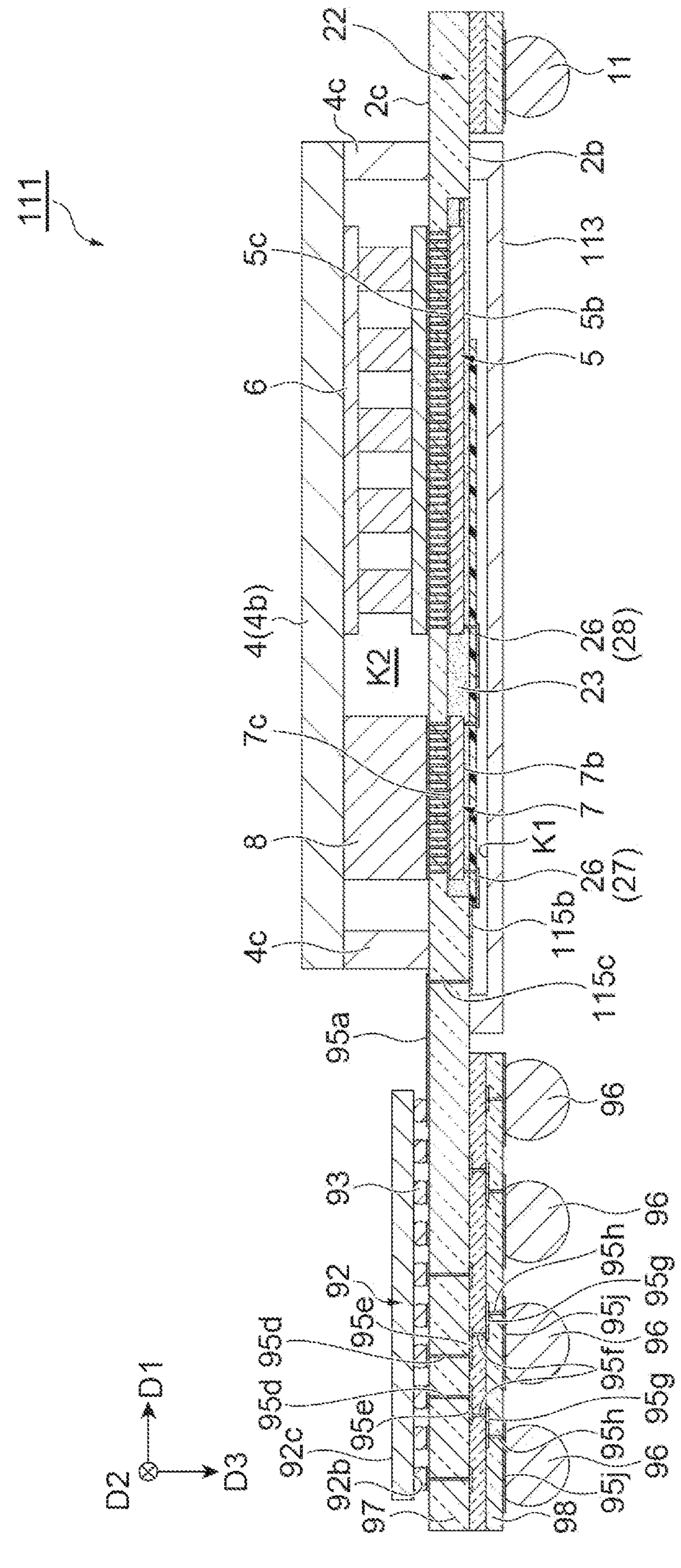
FIG. 17 is a cross-sectional view illustrating an optical module according to Modified Example 10.

FIG. 17 is a cross-sectional view illustrating an optical module 111 according to Modified Example 10. The optical module 111 has a first housing 113. The area of the first housing 113 as viewed along the third direction D3 is larger than the area of the second housing 4 as viewed along the third direction D3. The end of the first housing 113 in the first direction D1 protrudes further to the second electrical element 92 than the end of the second housing 4 in the first direction D1. That is, as viewed along the third direction D3, the side wall portion of the first housing 113 is located between the side wall portion 4*c* of the second housing 4 and the second electrical element 92. The optical module 111 includes electrical wiring 115*b* located inside (first airtight space K1) the first housing 113, and electrical wiring 115*c* penetrating the board 22 from the electrical wiring 115*b* in the third direction D3.

Figure 18:
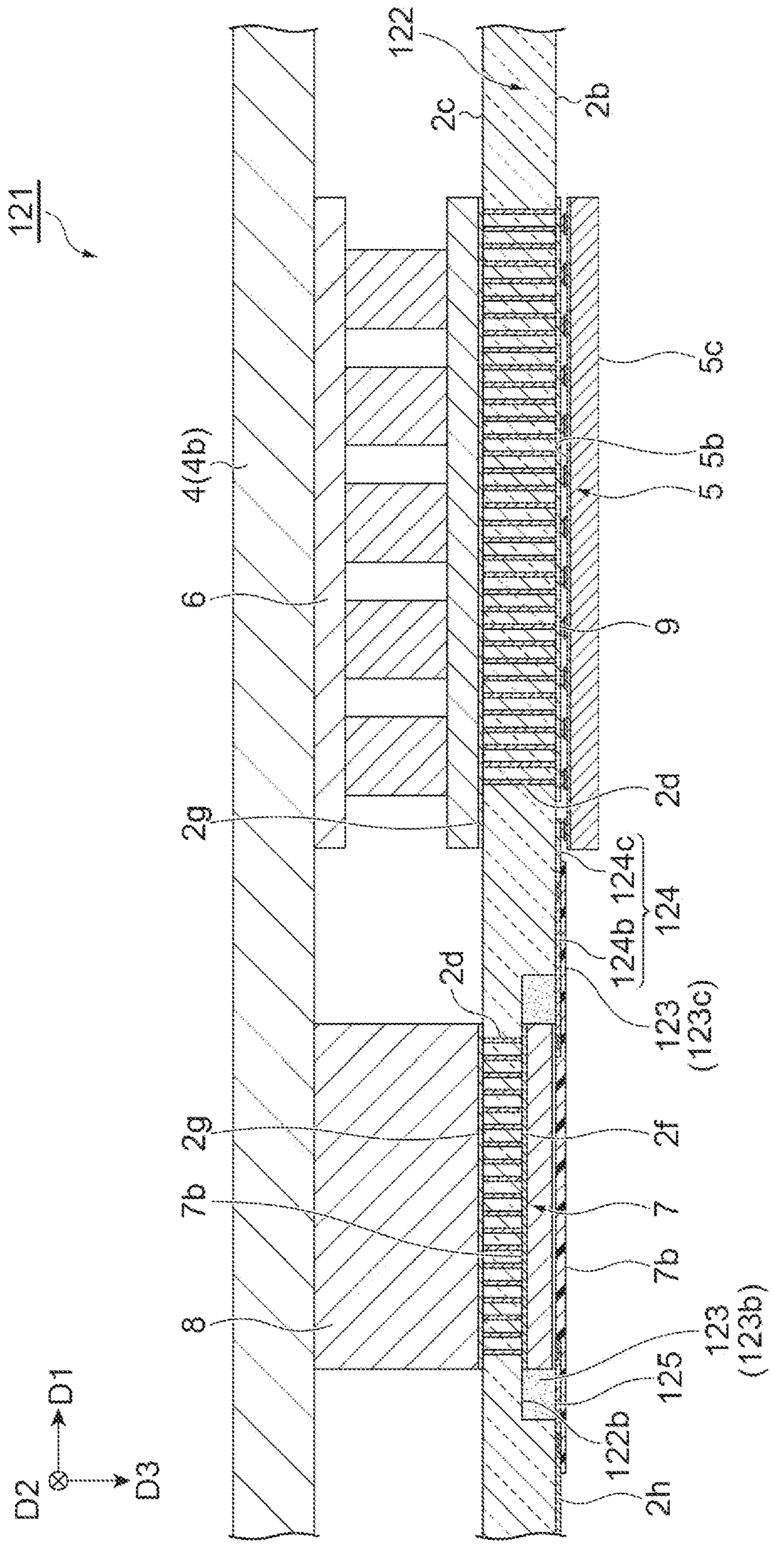
FIG. 18 is a cross-sectional view illustrating an optical module according to Modified Example 11.

FIG. 18 is a cross-sectional view illustrating an optical module 121 according to Modified Example 11. The optical module 121 has a board 122. The first face 2*b* of the board 122 has a recessed portion 122*b*, the electrical element 7 is mounted within the recessed portion 122*b*, and the optical element 5 is mounted outside the recessed portion 122*b*. The optical element 5 is mounted (flip-chip-mounted) so that the circuit layer faces the board 122. The electrical element 7 is mounted face-up on the board 122.

The optical module 121 further includes a resin layer 123 filled in the recessed portion 122*b*. The resin layer 123 includes a first resin layer 123*b* similarly to the first resin layer 33*b*, and a second resin layer 123*c* similarly to the second resin layer 33*c*. The optical module 121 has electrical wiring 124 connecting the optical element 5 and the electrical element 7 to each other, and electrical wiring 125 connecting the electrical wiring 2*h* of the board 122 and the electrical element 7 to each other. The electrical wiring 124 includes a first portion 124*c* formed on the first face 2*b* of the board 122, and a second portion 124*b* formed from the end of the first portion 124*c* over the resin layer 123 (the first resin layer 123*b*) to the electrode of the electrical element 7. The first portion 124*c* (first wiring) is, for example, copper (Cu) or gold (Au) wiring. The first portion 124*c* may be formed similarly to the thermal pad on the first face 2*b* of the board 122. The second portion 124*b* (second wiring) is, for example, inkjet wiring or plated wiring (RDL). The first wiring and the second wiring are connected to each other in series. The connection location may be formed so that the second wiring 124*b* overlaps with the first wiring 124*c* in the plan view of the board 122. The electrical wiring 124 may be the electrical wiring in which the first portion 124*c* and the second portion 124*b* are formed simultaneously (at one time). The electrical wiring 125 is, for example, an inkjet wiring or plated wiring (RDL) formed from the end of the electrical wiring 2*h* over the resin layer 123 (the first resin layer 123*b*) to the electrode of the electrical element 7. The electrical wiring 2*h* and the electrical wiring 125 are connected to each other in series. At the connection location, the electrical wiring 125 may be formed to overlap with the electrical wiring 2*h*.

Figure 19:
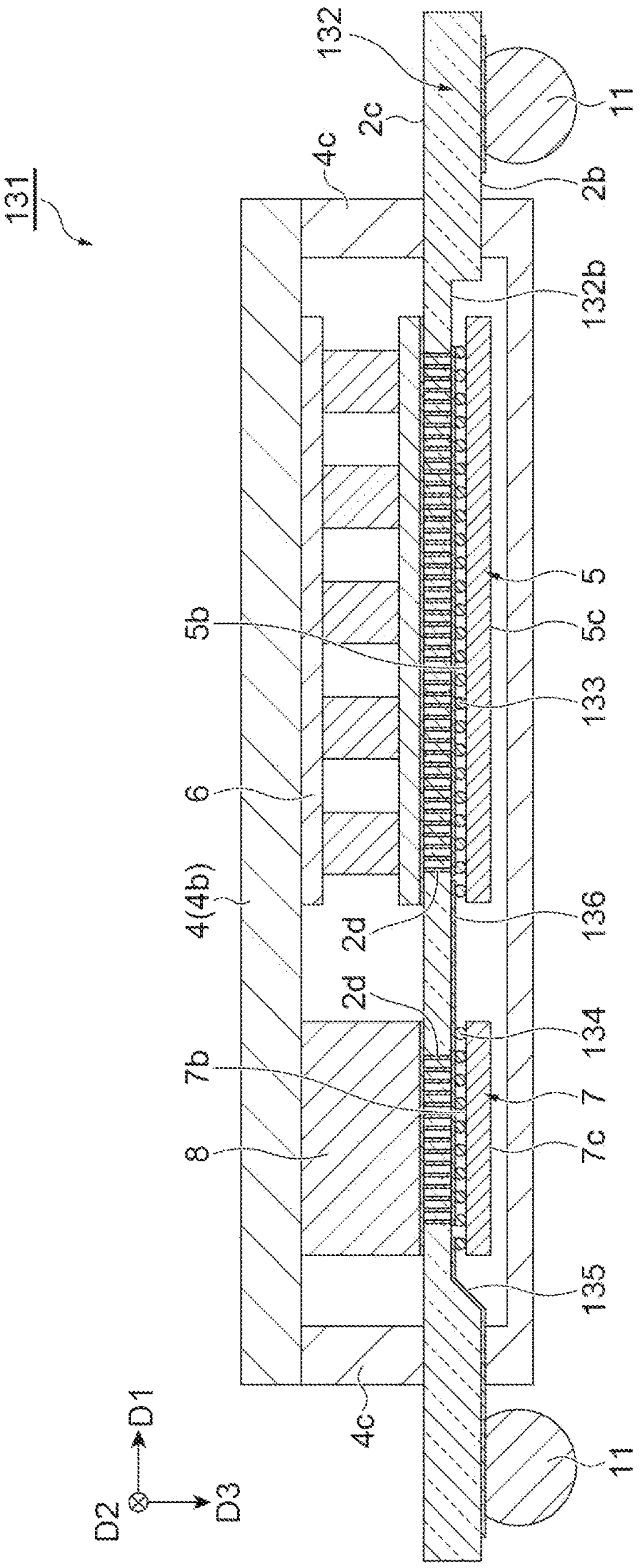
FIG. 19 is a cross-sectional view illustrating an optical module according to Modified Example 12.

FIG. 19 is a cross-sectional view illustrating an optical module 131 according to Modified Example 12. The optical module 131 has a board 132, and a recessed portion 132*b* is formed in a first face 2*b* of the board 132. In the optical module 131, the optical element 5 and the electrical element 7 are both flip-chip-mounted. The first face 5*b* of the optical element 5 is connected to the board 2 through a bump 133, and the first face 7*b* of the electrical element 7 is connected to the board 2 through a bump 134.

The optical module 131 has electrical wiring 136 electrically connecting the optical element 5 and the electrical element 7 to each other. The configuration of the electrical wiring 136 is, for example, the same as the configuration of the electrical wiring 10 described above. The optical module 131 has electrical wiring 135 extending from the bump 134 to the outside of the first housing 3 in the recessed portion 132*b*. The electrical wiring 135 extends from the bottom face of the recessed portion 132*b* to the outside of the recessed portion 132*b*. The terminal 11 is connected to the portion of the electrical wiring 135 located outside the first housing 3. For example, the portion of the inner face of the recessed portion 132*b* where the electrical wiring 135 is formed is inclined with respect to the third direction D3. In this case, loss of high frequency signals due to reflection and the like can be reduced.

Figure 20:
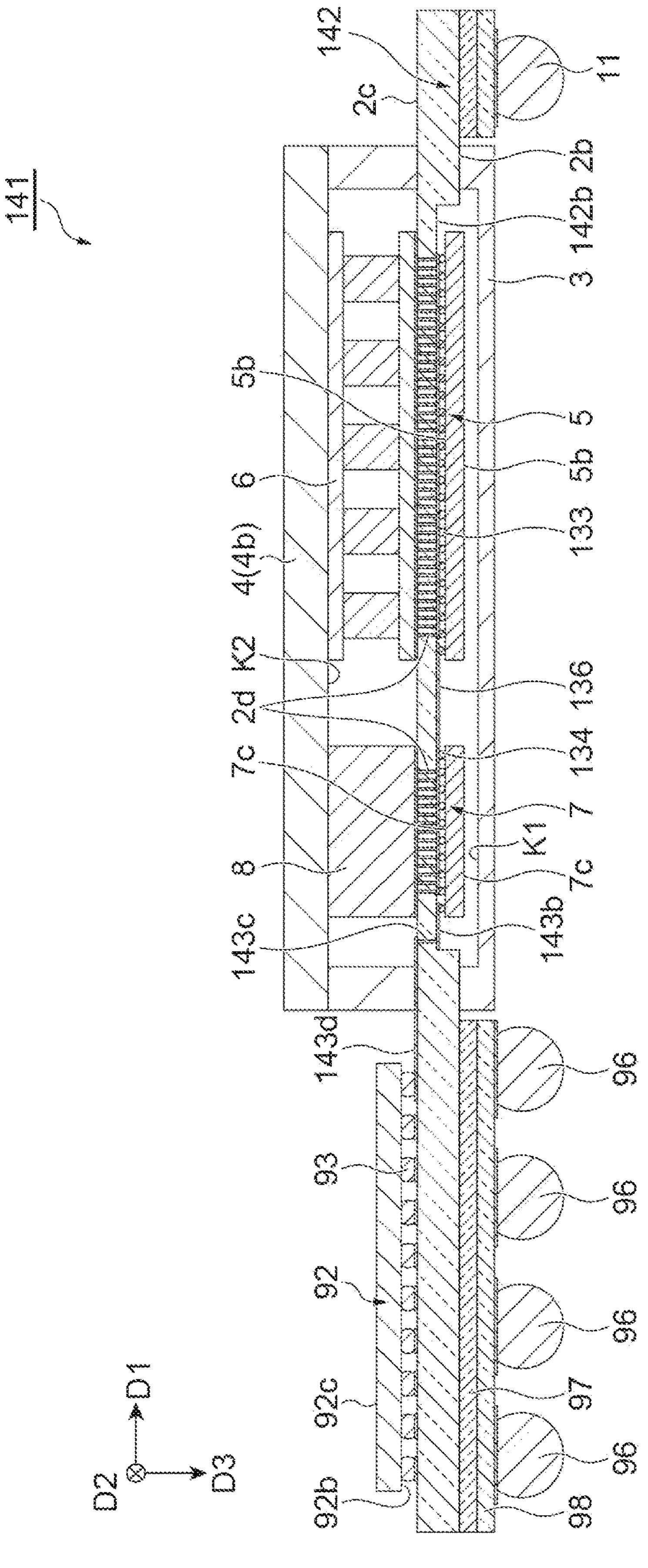
FIG. 20 is a cross-sectional view illustrating an optical module according to Modified Example 13.

FIG. 20 is a cross-sectional view illustrating an optical module 141 according to Modified Example 13. It is noted that in FIG. 20, illustration of the structure around the second electrical element 92 is simplified. The optical module 141 has a board 142 in which a recessed portion 142*b* is formed. The optical module 141 includes electrical wiring 143*b* electrically connected to the electrical element 7 and extending along the bottom face of the recessed portion 142*b*, electrical wiring 143*c* that is the TGV penetrating the board 142 from the electrical wiring 143*b* in the third direction D3, and electrical wiring 143*d* extending from the electrical wiring 143*c* to the outside of the second housing 4. The electrical wiring 143*d* extends from the second airtight space K2 to the electrode 93 electrically connected to the second electrical element 92. By extending the electrical wiring 143*c* from the electrical wiring 143*b* extending along the bottom face of the recessed portion 142*b*, the length of the electrical wiring 143*c* can be allowed to be shorter than the thickness (length in the third direction D3) of the board 142. As a result, the high frequency characteristics are further improved.

The embodiments and various modified examples according to the present disclosure have been described above. However, the present invention is not limited to the above-described embodiments or various modified examples, and can be modified as appropriate within the scope of the spirit described in the claims. Further, the optical module according to the present disclosure may be a combination of the above-described embodiments and a plurality of modified examples from Modified Example 1 to Modified Example 13. For example, the configuration, shape, size, material, number, and arrangement of each portion of the optical module according to the present disclosure are not limited to the embodiments or modified examples described above, and can be changed as appropriate.

What is claimed is:

1. An optical module comprising:

a glass board having a first face, a second face opposite to the first face, and a plurality of first vias and a plurality of second vias each penetrating between the first face and the second face, the glass board being made of glass, the first vias being two-dimensionally arranged in a plan view of the glass board, the second vias being two-dimensionally arranged in the plan view of the glass board;

an electrical element fixed to only the first face of the glass board, and being a semiconductor circuit component configured to process an electrical signal, the electrical element including at least one of a driver circuit or an amplifier;

a heat conduction member mounted on the second face of the glass board and thermally connected to the electrical element through the plurality of first vias;

an optical element fixed to only the first face of the glass board and being a semiconductor component configured to convert between the electrical signal and an optical signal;

a temperature control element mounted on the second face of the glass board, thermally connected to the optical element through the plurality of second vias, and for adjusting the temperature of the optical element;

a first housing connected to the first face of the glass board and hermetically sealing the electrical element and the optical element; and electrical wiring electrically connecting the electrical element to the optical element and constituting a transmission line for transmitting the electrical signal between the electrical element and the optical element, the electrical wiring being formed within the first housing.

2. The optical module according to claim 1, wherein the electrical wiring is formed on the first face of the glass board.

3. The optical module according to claim 1, further comprising a resin layer filled between the electrical element and the optical element, wherein the electrical wiring is a metal film formed on the resin layer.

4. The optical module according to claim 1, wherein the first face of the glass board has a recessed portion, further comprising a resin layer filled in the recessed portion, and wherein the electrical wiring has a first portion formed on the first face of the glass board and a second portion formed on the resin layer.

5. The optical module according to claim 4, wherein the first portion is a first wiring formed on the first face, wherein the second portion is a second wiring formed on the resin layer, and wherein the first wiring and the second wiring are connected to each other in series.

6. The optical module according to claim 1, wherein the first face of the glass board has a recessed portion, and wherein the electrical element and the optical element are mounted within the recessed portion.

7. The optical module according to claim 6, wherein the recessed portion includes a first recessed portion and a second recessed portion independent of each other, wherein the electrical element is mounted within the first recessed portion, and wherein the optical element is mounted within the second recessed portion.

8. The optical module according to claim 1, wherein the first face of the glass board has a recessed portion, and wherein the electrical element is mounted within the recessed portion, and the optical element is mounted outside the recessed portion.

9. The optical module according to claim 1, wherein the first face of the glass board has a recessed portion, and wherein the optical element is mounted within the recessed portion, and the electrical element is mounted outside the recessed portion.

10. The optical module according to claim 1, wherein the first vias and second vias have a thermal conductivity larger than the thermal conductivity of the glass board.

11. The optical module according to claim 1, further comprising a second housing mounted on the second face of the glass board and having a heat radiation member opposite to the second face of the glass board, wherein the second housing hermetically seals the heat conduction member and the temperature control element, wherein the heat conduction member and the temperature control element are thermally connected to the heat radiation member, and wherein the heat conduction member and the temperature control element are interposed between the heat radiation member and the glass board.

12. The optical module according to claim 1, wherein the glass board has a linear expansion coefficient less than 10 [ppm/K].

* * * * *